US006545902B2

(12) United States Patent
Sakata et al.

(10) Patent No.: US 6,545,902 B2
(45) Date of Patent: Apr. 8, 2003

(54) FERROELECTRIC MEMORY DEVICE

(75) Inventors: Takeshi Sakata, Kodaira (JP);
Tomonori Sekiguchi, Kokubunji (JP);
Hiroki Fujisawa, Ome (JP); Katsutaka Kimura, Akishima (JP); Masanori Isoda, Sayama (JP); Kazuhiko Kajigaya, Iruma (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 09/987,590

(22) Filed: Nov. 15, 2001

(65) Prior Publication Data

US 2002/0027799 A1 Mar. 7, 2002

Related U.S. Application Data

(62) Division of application No. 09/558,104, filed on Apr. 25, 2000, now Pat. No. 6,330,178, which is a division of application No. 09/125,545, filed as application No. PCT/JP96/00464 on Feb. 28, 1996, now Pat. No. 6,097,623.

(51) Int. Cl.[7] .............................................. G11C 11/22
(52) U.S. Cl. ...................................... 365/145; 365/203
(58) Field of Search ................................ 365/145, 149, 365/203, 205, 189.09

(56) References Cited

U.S. PATENT DOCUMENTS

| 5,297,077 A | * | 3/1994 | Imai et al. ................... 365/145 |
|---|---|---|---|
| 5,367,279 A | | 11/1994 | Yamagata .................... 365/222 |
| 5,455,786 A | | 10/1995 | Takeuchi et al. ............. 365/145 |
| 5,515,312 A | | 5/1996 | Nakakuma et al. .......... 365/145 |
| 5,517,446 A | * | 5/1996 | Ihara ........................... 365/145 |
| 5,539,279 A | | 7/1996 | Takeuchi et al. ............. 365/145 |
| 5,544,110 A | | 8/1996 | Yuh ............................. 365/205 |
| 5,546,342 A | | 8/1996 | Nakane et al. ........... 365/189.01 |
| 5,555,523 A | | 9/1996 | Haga et al. ................... 365/203 |
| 5,666,315 A | * | 9/1997 | Tsukude et al. ............. 365/149 |
| 5,815,451 A | * | 9/1998 | Tsuchida .................... 365/149 |
| 6,144,599 A | | 11/2000 | Akita et al. ................. 365/203 |

FOREIGN PATENT DOCUMENTS

| JP | 61-142593 | 6/1986 |
|---|---|---|
| JP | 62-012992 | 1/1987 |
| JP | 62-180591 | 8/1987 |
| JP | 2-110893 | 4/1990 |

(List continued on next page.)

OTHER PUBLICATIONS

Itoh, "Advanced Electronics I–9, Ultra LSI Memories", 1994, Chapter 3, pp. 214–221.
"An Experimental 1.5–V 64–Mb DRAM", IEEE, Journal of Solid State Circuits, vol. 26, No. 4, Apr. 1991, pp.465–472.
"A Single–Transistor Ferroelectric Memory Cell", IEEE Int'l Solid–State Conference, Digest of Technical Papers, pp 68–69, Feb. 1995.

Primary Examiner—Son Mai
(74) Attorney, Agent, or Firm—Antonelli, Terry, Stout & Kraus, LLP

(57) ABSTRACT

Since a ferroelectric memory device cannot employ a VCC/2 precharge scheme widely used in DRAM, its array noise and power consumption are large. Further, a ferroelectric capacitor is deteriorated in its characteristics due to its fatigue and imprint. To avoid this, data line pairs are precharged to two voltages VCC and VSS. As a result, a voltage on a data line in a memory cell array MCA varies symmetrically with respect to VCC/2 as its center to thereby reduce the array noise. Further, when early sense and early precharge operations are carried out based on charge sharing between data lines of different precharge voltages, the power consumption can be reduced. Furthermore, when the precharge voltages are switched for respective data lines, reverse and non-reverse polarization are alternately carried out in the ferroelectric capacitor in the memory cell to suppress its fatigue and imprint.

31 Claims, 36 Drawing Sheets

FOREIGN PATENT DOCUMENTS

| | | |
|---|---|---|
| JP | 3-283176 | 12/1991 |
| JP | 4-184787 | 7/1992 |
| JP | 5-135580 | 6/1993 |
| JP | 6-60650 | 3/1994 |
| JP | 6-208796 | 7/1994 |
| JP | 6-302193 | 10/1994 |

\* cited by examiner

FERROELECTRIC MEMORY DEVICE

This application is a divisional of application Ser. No. 09/558,104, filed on Apr. 25, 2000 now U.S. Pat. No. 6,330,178, which, in turn, is a divisional of application Ser. No. 09/125,545, filed on Aug. 28, 1998, now U.S. Pat. No. 6,097,623, which is a section 371 of International Application PCT/JP96/00464, filed Feb. 28, 1996; and the entire disclosures of all of which are hereby incorporated by reference.

TECHNICAL FIELD

The present invention relates to a ferroelectric memory device. And more particularly, the invention relates to a ferroelectric memory device having memory cells each of which is made up of a capacitor with an insulating film of ferroelectric material and a MOS transistor.

BACKGROUND ART

As a nonvolatile memory realizing high-speed write operation, much attention has been recently focused on a ferroelectric memory which uses a ferroelectric capacitor. In particular, a memory of such a type that each memory cell is made up of a capacitor with an insulating film of ferroelectric material and a MOS transistor and a constant voltage is applied to one of electrodes of the capacitor called a plate has a possibility of being able to realize a nonvolatile memory with nearly the same operating speed and area as those of a dynamic random access memory (DRAM). An example of a basic arrangement of such a prior art ferroelectric memory is shown in FIG. 36. In the drawing, reference symbol MC denotes a memory cell, which is made up of a ferroelectric capacitor with an insulating film of ferroelectric material such as PZT and an NMOS transistor. The remanent polarization of the ferroelectric capacitor stores information. The ferroelectric capacitor is connected at its one end to the NMOS transistor and at the other end (plage electrode) to ½ voltage (VCC/2) corresponding to half of a source voltage VCC. For simplicity, only one memory cell MC is illustrated in the illustrated example, but actually a plurality of such memory cells are connected to each of a pair Dt and Db of data lines and are selected by a word line W for data transfer to the data-line pair Dt or Db. Although omitted for simplicity in the drawing, a dummy cell is actually provided to each of the data-line pair Dt and Db. Reference symbol PC denotes a precharge circuit which precharges the data-line pair Dt and Db to a ground voltage VSS. Reference symbol SA denotes a sense amplifier which detects voltages of the data-line pair Dt and Db and amplifies the voltages differentially. Further, though omitted for simplicity in the drawing, a switch is actually provided to the sense amplifier for signal transfer to or from external.

The operation of the above arrangement will be explained with use of a timing chart shown in FIG. 37. In a standby state, a control signal FPC causes the precharge circuit PC to be put in its ON state, so that the data-line pair Dt and Db are precharged to the ground voltage VSS, that is, are in a so-called VSS precharge state. In operation, the control signal FPC causes the precharge circuit PC to be turned OFF. Thus when the word line W has a selected-word-line voltage VCH, the memory cell MC is selected. This causes an NMOS transistor in the memory cell MC to be turned ON, so that a voltage of VCC/2 corresponding to a difference in voltage between a data line Dt and a plate electrode is applied to the ferroelectric capacitor, whereby the remanent polarization is read out as charge to the data line Dt. This varies the voltage on the data line Dt and then a control signal FSA activates the sense amplifier SA, which in turn amplifies the voltage of the data line D with positive feedback to sense data. Though not illustrated in FIG. 37, when the data sensed by the sense amplifier SA is output externally, read operation is carried out. Further, when the voltage of the data line is used as a write voltage in accordance with externally entered data, write operation is carried out. When the word line W is lowered to turn OFF the NMOS transistor in the memory cell MC, rewrite operation to the memory cell MC is carried out. Thereafter, the control signal FSA stops the operation of the sense amplifier SA, the control signal FPC turns ON a precharging switch, thus returning the current state to the standby mode.

The operation of the ferroelectric capacitor in the standby mode will be explained with use of a hysteresis characteristic shown in FIG. 38. In the drawing, horizontal axis denotes a voltage applied to the ferroelectric capacitor with the voltage of the plate electrode as a reference, and vertical axis denotes a charge amount stored in the ferroelectric capacitor including polarization. In such a condition that no voltage is applied to the ferroelectric capacitor in the standby state, the ferroelectric capacitor retains remanent polarization and takes a position of either point PS0 or PS1 in FIG. 38 depending on data "0" or "1" stored in the capacitor. When it is desired to read out a signal from the memory cell MC to the data line D, the data line D is precharged to −VCC/2 with the voltage of the plate electrode as a reference, so that a data-line capacitance CD is represented by load lines LL0 and LL1 having a gradient of −CD in FIG. 38. Intersections of the load lines and hysteresis characteristics are points which the ferroelectric capacitor takes in its read mode. Meanwhile, the write operation is carried out when the capacitors takes a point PW0 or PW1 in FIG. 38 with the data line D having the voltage of VSS or VCC.

As has been explained above, in the ferroelectric memory device, the voltage is applied to the ferroelectric capacitor to cause the reverse polarization to generate charge on the data line.

The following schemes which relate to the present application and are directed to DRAMs have been disclosed.

Disclosed in JP-A-62-180591 is a scheme of dividing a precharge voltage of a data-line pair into two in order to reduce array noise.

Also disclosed in JP-A-5-135580 is a scheme of transferring charge between sense amplification groups in order to reduce a charge amount consumed in rewrite and precharge operation.

Further disclosed in JP-A-4-184787 is a scheme of dividing a precharge voltage of a data-line pair in a memory cell array into two to transfer charge between two data-line pairs. The present application will be explained in association with these schemes.

DISCLOSURE OF INVENTION

In a ferroelectric memory device, in order to generate a signal voltage on a data line, a voltage must be applied to a ferroelectric capacitor. Thus, when a plate is set to have a constant voltage, it is impossible to employ the scheme which reads out a signal with the data line precharged to VCC/2 and is widely used in DRAM fields, that is, a so-called VCC/2 precharge scheme. And the ferroelectric memory device has drawbacks including the three problems discussed below, when compared to a DRAM of the above VCC/2 precharge scheme.

First, the device has a large array noise. More specifically, a ferroelectric memory employs a VSS precharge scheme (or VCC precharge scheme). Thus a signal is read-out from one memory cell in all data lines, the voltage varies from VSS toward a higher level (from VCC toward a lower level in the VCC precharge scheme). For this reason, large coupling noise takes place in non-selected word lines or wells coupled capacitively with them. The noise is again capacitively coupled with the data lines to fluctuate the voltages of the data lines. Meanwhile, when a voltage at a storage-node in a selected memory cell drops, a plate voltage is lowered through a ferroelectric capacitor. This voltage applied to the ferroelectric capacitor in the memory cell becomes small, so that a part of the remanent polarization of ferroelectric material to be read out as charge becomes small in amount, thus decreasing an S/N ratio. In the VSS precharge scheme, when a voltage between the data-line pair is amplified by a sense amplifier, one of the voltages of the data lines in the pair is charged to VCC by the sense amplifier with a large variation, whereas the other voltage is discharged to VSS with a small variation. For this reason, great coupling noise takes place in all nodes capacitively coupled with the data-line pair, increasing the voltage. The noise is again capacitively coupled with the data lines so that differences in the magnitude of coupling capacitance between the data line pairs result in differential noise, thus reducing the S/N ratio. For such noise, DRAM is described in detail in a book entitled "Advanced Electronics I-9, Ultra LSI Memories", written by Kiyoo Itoh, issued from Baifuukan, 1994, Chapter 3. The discussion in the book also holds true for the ferroelectric memory. Further, the voltage of the data line discharged to VSS is boosted due to coupling, the MOS transistor of the memory cell connected to the data line discharged to VSS is conducted so that VSS is input to the ferroelectric capacitor, with a danger of destroying the polarization data.

Second, power consumption is great. Either one of the data lines Dt and Db in pair is charged to VCC from VSS during its amplification, and is discharged again to VSS during its precharge operation. The amount of charge then consumed is CD×VCC per data line pair, when the data line capacitance is CD. In the VCC/2 precharge scheme, one of the data lines in pair is charged from VCC/2 to VCC, the other is discharged from VCC/2 to VSS, and precharge is carried out through charge share between the data lines in pair. Therefore, a consumed charge amount per data-line pair is CD×VCC/2. Thus the VSS precharge scheme requires a power necessary for charge and discharge of the data lines to be twice as high as that of the VCC/2 precharge scheme.

Third, the characteristics of the ferroelectric capacitor are largely deteriorated by its fatigue and imprint. When read operation is carried out in the VSS precharge mode, the polarization direction of the ferroelectric capacitor having "1" so far written therein is reversed. Further, since VCC is applied to rewrite "1", the polarization direction is again reversed. The repetition of the above operation results in characteristic deterioration caused by the fatigue. Meanwhile, the repetitive application of VSS results in that the characteristics of the capacitor having "0" written therein are deteriorated by. the imprint. That is, the fatigue or imprint becomes remarkable depending on the written data. Rewrite operation is carried out for all the memory cells on the selected word line and the read operation is generally carried out more frequently than the reverse write operation, with the result that the same data is often repetitively written. This leads to the aforementioned fatigue and imprint phenomena.

It is an object of the present invention to solve problems in the above prior art ferroelectric memory device.

A first object of the present invention is to realize a high S/N ratio and stable operation by minimizing an array noise generated when a memory cell using a ferroelectric capacitor generates a signal voltage.

A second object is to realize a low necessary power by reducing the amount of charge consumed for rewriting and precharging.

A third object is to realize a high reliability by suppressing fatigue and imprint of a ferroelectric capacitor.

Other objects will become clear from description of embodiments which follow.

In accordance with the present invention, the above objects are attained by providing a ferroelectric memory device which includes first and second memory cells (MC1) each having a ferroelectric capacitor with an insulating film of ferroelectric material and having a transistor connected to one of electrodes of the ferroelectric capacitor, a first data line (D0$t$) connected to said transistor of said first memory cell, a second data line (D1$t$) connected to said transistor of said second memory cell, word lines connected to control electrodes of the transistors of said first and second memory cells, and first and second sense amplifiers (SA0, SA1) provided as associated with said first and second data lines; and which further comprises a first precharge circuit (PC0) for connecting said first data line to a first precharge potential (Vss); and a second precharge circuit (PC1) for connecting said second data line to a second precharge potential (Vcc); and wherein a potential (Vcc/2) of the other electrodes of said ferroelectric capacitors of said first and second memory cells is set to be between said first and second precharge potentials.

More desirably, a difference between the potential of the other electrodes of said ferroelectric capacitors and said first precharge potential is equal to a difference between the potential of the other electrode of said ferroelectric capacitors and said second precharge potential. That is, an average of the first and second precharge potentials is set at a voltage close to an average of a write voltage of "1" and a write voltage of "0". More in detail, the above first to third objects are attained by using first to third means which follow respectively.

The first means comprises word lines connected to control electrodes of transistors in said first and second memory cells (refer to FIGS. 1 and 2). Thereby noise from the first data line and noise from the second data line are cancelled from each other to cancel noise toward the word lines, thus attaining the first object.

A scheme of dividing the precharge voltages into two in DRAM is disclosed in JP-A-62-180591 or JP-A-4-184787. When a similar scheme to the above is used for such a ferroelectric memory device as to require Vcc precharge or Vss precharge, there can be satisfied an essential requirement inherent in a ferroelectric memory device that a voltage be applied to a ferroelectric capacitor at word-line activation. With respect to DRAM, it is common sense that, when factors including S/N ratio, power consumption and operational speed are generally considered, a VCC/2 precharge scheme is excellent. In such a ferroelectric memory device that a plate voltage is set to be constant, however, since the VCC/2 precharge scheme cannot be employed, such a scheme becomes effective means.

The second means comprises:
    first and second memory cells each including a ferroelectric capacitor with an insulating film of ferroelectric material and including a transistor connected to one of electrodes of the ferroelectric capacitor;

first and second data lines (D0tS, D0TC) connected to said corresponding first and second memory cells;

a first precharge circuit (PC0S) for connecting said first data line to a first precharge potential;

a second precharge circuit (PC0C) for connecting said second data line to a second precharge potential;

a first sense amplifier (SA0S) made up of two P-channel MOS transistors cross-coupled for detecting data from said first memory cell appearing on said first data line;

a second sense amplifier (SA0C) made up of two N-channel MOS transistors cross-coupled for detecting data from said second memory cell appearing on said second data line;

a first driving line (CSPS) for driving said first sense amplifier;

a second driving line (CSNC) for driving said second sense amplifier; and a switch circuit (CSD) for allowing continuity between said first and second driving lines after potentials (Vss, Vcc) are supplied to said first and second driving lines to put said first and second sense amplifiers in their non-driving state respectively and then the supply is stopped (refer to FIGS. 20 and 21).

With the above arrangement, the second object is attained. A scheme of performing charge transfer between two groups of sense amplifiers in DRAM is disclosed in JP-A-5-135580. In this prior art, charge transfer is carried out between the sense amplifier group after data line amplification and the sense amplifier group for the next amplification. For this reason, this is effective when the sense amplifier groups are sequentially activated in a given order as in the self-refresh operation of DRAM, but its applicable operation is limited. For example, when the identical sense amplifier group is activated twice continuously, this scheme cannot be used. Meanwhile, in the present means, since charge transfer is carried out between the sense amplifier groups of different precharge voltages, this scheme can be applied to usual random access operation. Further, with respect to DRAM, JP-A-4-184787 discloses a scheme of grouping precharge voltages of a data line pair in a memory cell array into two for data transfer between two of data line pairs. When such a scheme is applied to a ferroelectric memory device, a requirement that a voltage be applied to a ferroelectric capacitor at word-line activation, can be attained. For such a ferroelectric memory device as not to employ the VCC/2 precharge scheme, this scheme is effective means.

The third means comprises:

memory cells each including a ferroelectric capacitor with an insulating film of ferroelectric material and including a transistor connected to one of electrodes of the ferroelectric capacitor;

a data line (D0t) connected to the memory cells; and a precharge circuit (PC0) for precharging said data line to a first or second precharge potential, and wherein the potential (Vcc/2) of the other electrodes of said ferroelectric capacitors of said memory cells is set to be between said first precharge potential (Vss) and said second precharge potential (Vcc), and said precharge circuit alternately precharges said data line with said first and second precharge potentials (refer to FIG. 26).

Thereby, two sorts of Vss and Vcc precharge schemes can be applied with a high possibility to the identical memory cell, thus attaining the third object.

Further, means corresponding to a combination of the above means enables simultaneous attainment of a combination of the effects of the above means.

BEST MODE FOR CARRYING OUT THE INVENTION

First to third embodiments corresponding to the above first to third means will be explained.

[First Embodiment]

Figure 1:
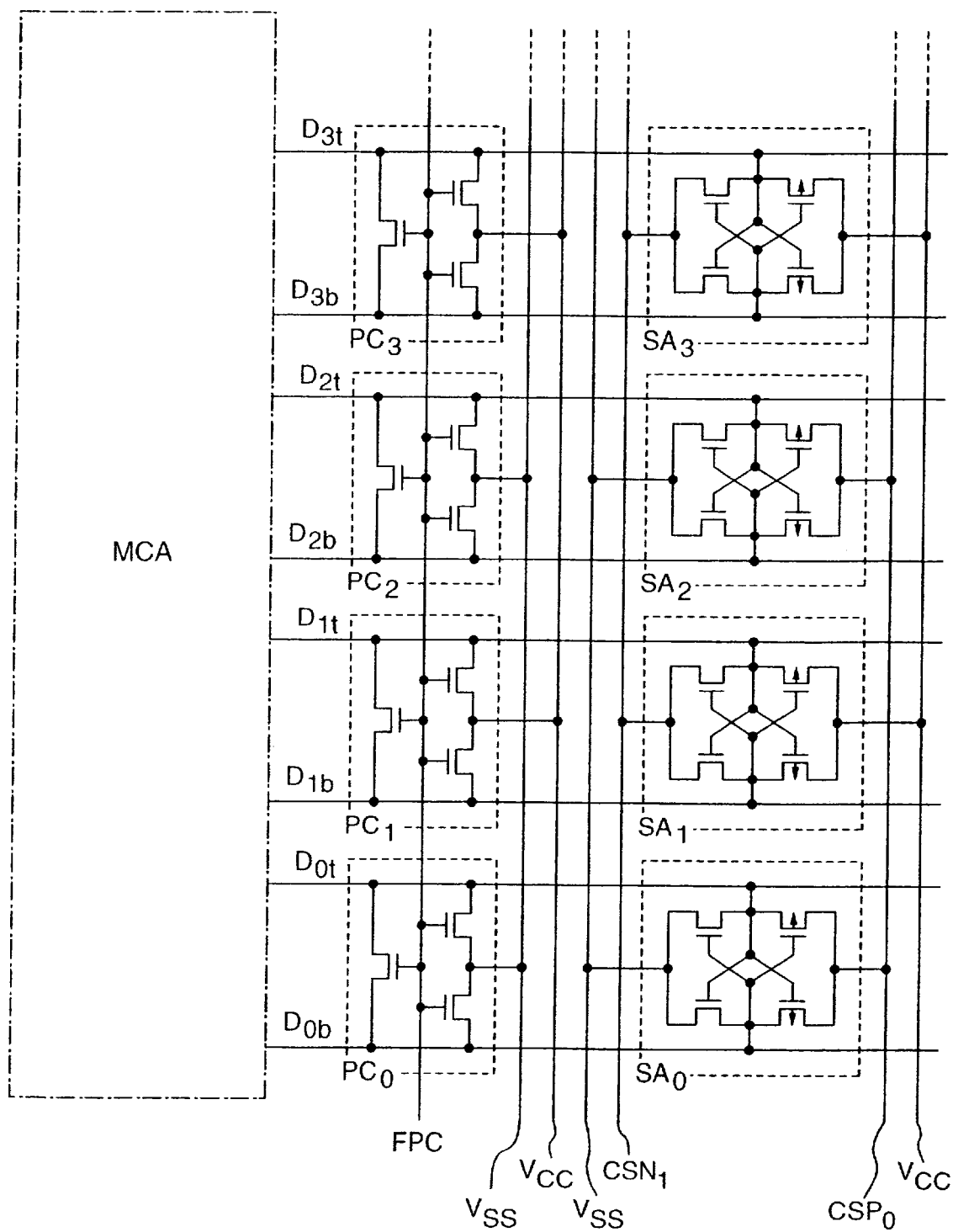
FIG. 1 shows an exemplary basic arrangement of a first embodiment.

First, an embodiment of realizing the above first means will be explained. A major part of an exemplary arrangement of the embodiment is shown in FIG. 1. This embodiment is featured in that precharge voltages of data-line pairs in a memory cell array are divided into two. Connected to data-line pairs D0$b$ and D0$t$, D1$b$ and D1$g$, . . . are precharge circuits PC0 PC1, . . . and sense amplifiers SA0, SA1, . . . Each of the precharge circuits is made up of 3 NMOS transistors. Supplied to the precharge circuits PC0 and PC2 is a ground voltage VSS, while supplied to the precharge circuits PC1 and PC3 is a source voltage VCC. Each of the sense amplifiers comprises a CMOS circuit which has the same configuration as a circuit widely used as a DRAM sense amplifier. NMOS transistors of the sense amplifiers SA0 and SA2, . . . are connected at their source terminals to the ground voltage VSS, while PMOS transistors of the sense amplifiers SA1 and SA3, . . . are connected at their source terminals to the source voltage VCC. For simplicity, I/O lines and I/O gates, etc. for data transfer to external devices are omitted.

Figure 2:
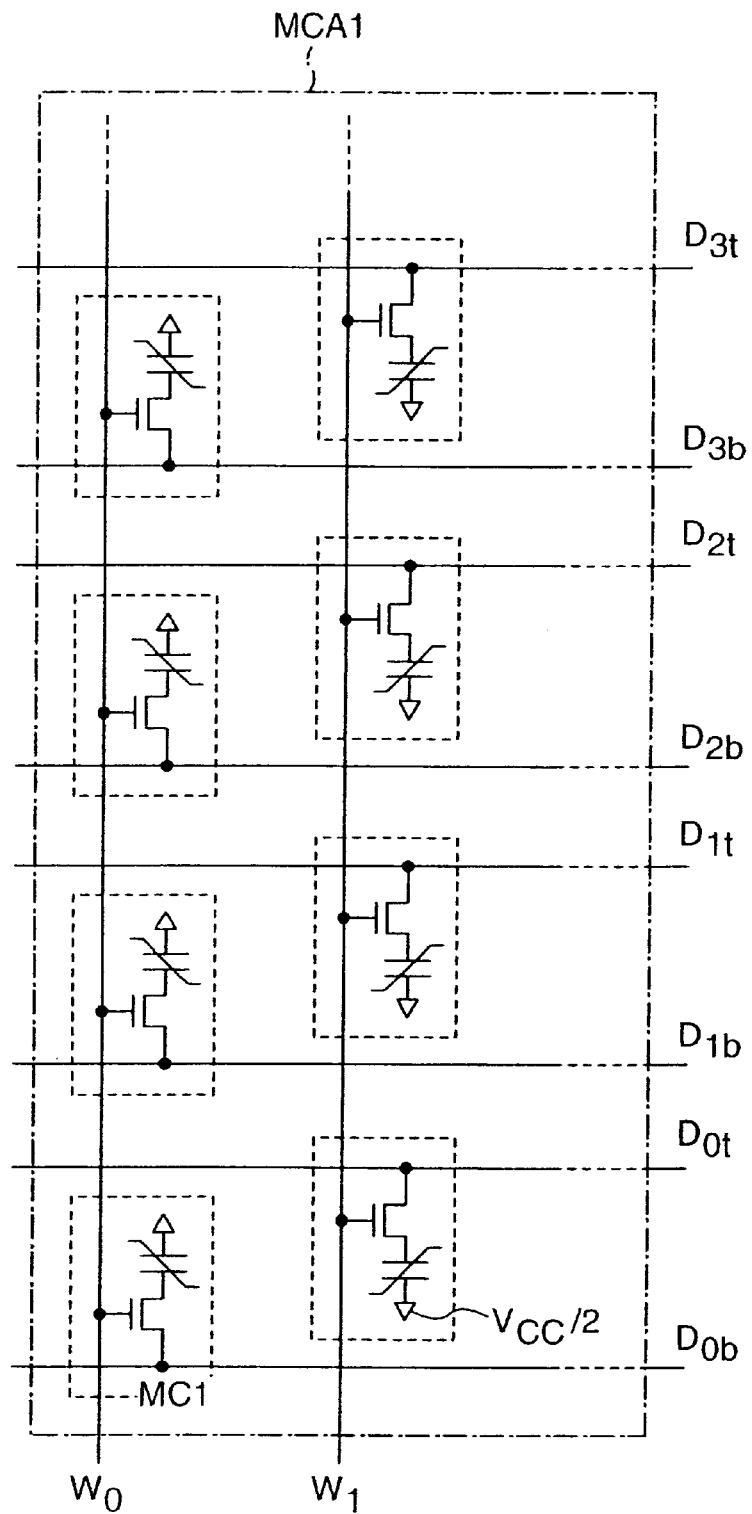
FIG. 2 shows an exemplary arrangement of a memory array.

Reference symbol MCA denotes a memory cell array which is formed, for example, as shown by MCA1 in FIG. 2. A multiplicity of memory cells MCls using a ferroelectric capacitor are provided at a desired intersection of the data-line pairs D0$b$ and Do$t$, D1$b$ and D1$t$, . . . and the word lines W0, W1, . . . This arrangement is the same as a so-called folded-data-line arrangement widely used in DRAM. The memory cell MC1 is made up of, for example, an insulating film of ferroelectric material such as lead zirconate titanate (PZT) and an NMOS transistor. Data is stored in the ferroelectric capacitor as remanent polarization. The ferroelectric capacitor is connected at its one electrode to the NMOS transistor and at the other electrode (plate electrode) to a node common to a plurality of memory cells to receive an intermediate voltage VCC/2. This memory cell has a structure similar to a one-transistor, one-capacitor type memory cell generally used for DRAM. In this way, the memory cell is made up of one MOS transistor and one ferroelectric capacitor to decrease a cell area, thus enabling its scaling. With this memory cell array structure, since signal reading operation is carried out only from one of data lines in pair, a mechanism for generating a reference signal is necessary for performing differential amplification by the sense amplifier. However, such a mechanism is omitted in the drawing for simplicity. Means for generating the reference signal is disclosed, for example, in JP-A-2-110893 or JP-A-6-302193.

Figure 3:
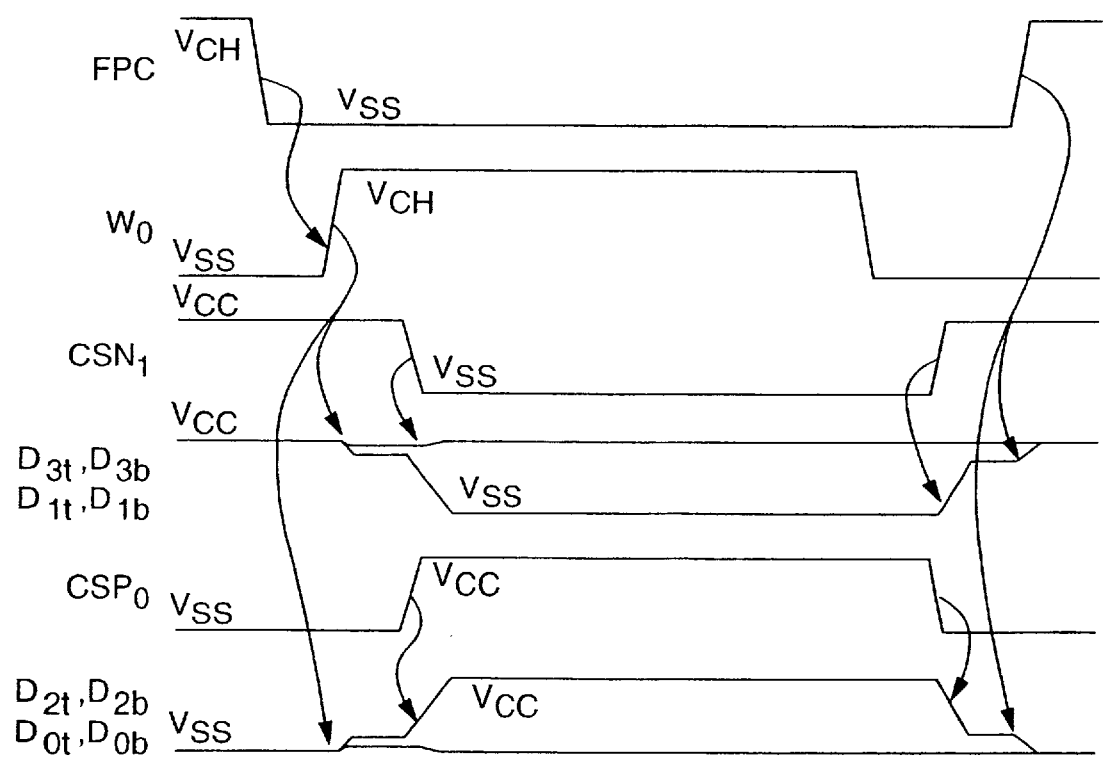
FIG. 3 is a basic operational timing chart of the first embodiment.

The operation of this structure example will be explained with use of a timing chart shown in FIG. 3. In the standby state, the control signal FPC is VCH such that the NMOS transistors in the precharge circuits PC0, PC1, . . . are turned ON, the data-line pairs D0$b$ and D0$t$, D2$b$ and D2$t$, . . . are precharged to VSS, and the data-line pairs D1$b$ and D1$t$, D3$b$ and D3$t$, . . . are precharged to VCC. That is, the data-line pairs are precharged to VSS and VCC alternately for every other pair. During operation, the control signal FPC causes the precharge circuits PC to be turned OFF. Thus, when the word line (W0 in FIG. 3) is set at a selected-word-line voltage VCH during selection, the memory cell MC1 is selected. At this time, the NMOS transistor in the selected memory cell MC1 is turned ON, a voltage corresponding to a difference between a voltage on the data line of the ferroelectric capacitor and the plate voltage VCC/2 is applied to the ferroelectric capacitor, and remanent polarization of the capacitor is read onto the data line in the form of charge. At this time, the voltage of the data-line pairs D0$b$ and D0$t$, D2$b$ and D2$t$, . . . rise from VSS, while the voltage of the data-line pairs D1$b$ and D1$t$, D3$b$ and D3$t$, . . . falls. And when a sense amplifier driving line CSP0 is set at VCC, the sense amplifiers SA0, SA2, . . . are activated; whereas, when a sense amplifier driving line CSN1 is set at VSS, the sense amplifiers SA1, SA3, . . . are activated to differentially amplify the voltages of the respective data-line pairs for data sense. At this time, the sense amplifier performs its amplifying operation with positive feedback, whereby one of the data lines in each pair is amplified to VSS and the other is amplified to VCC. For the data-line pairs D0$b$ and D0$t$, D2$b$ and D2$t$, . . . , however, a swing in the voltage of the data lines amplified to VSS is small; whereas a swing in the voltage of the data lines amplified to VCC is large. Conversely, for the data-line pairs D1$b$ and D1$t$, D3$b$ and D3$t$, . . . , a swing in the voltage of the data lines amplified to VSS is large; whereas a swing in the voltage of the data lines amplified to VCC is small. When the data is externally transferred under a condition that the sense amplifier amplified the data, read operation is carried out. When the voltage of the data lines is controlled according to the data externally given, write operation is carried out. When the voltage of the word line W0 is lowered to turn OFF the NMOS transistor in the memory cell MC1, rewrite operation is carried out. Thereafter, the sense amplifier driving line CSP0 is set at VSS and sense amplifier driving line CSN1 is set at VCC to stop the operation of the sense amplifier. And the control signal FPC causes the precharge circuit to be turned ON to return the current mode to the standby state. In this connection, the voltage applied to the ferroelectric capacitor attenuates with a leakage current flowing through the memory cell. In some cases, the intermediate voltage VCC/2 is applied to the memory cell to set the voltage applied to the ferroelectric capacitor at 0.

Through the operation explained above, the aforementioned first problem can be solved in such a manner as will be explained below. That is, when a signal is read out from the memory cell as charge, with respect to the voltages of the data-line pairs, the voltage of the data-line pairs D0$b$ and D0$t$, D2$b$ and D2$t$, . . . is changed from VSS to its higher level; whereas, the voltage of the data-line pairs D1$b$ and D1$t$, D3$b$ and D3$t$, . . . is changed from VCC to its lower level. In other words, these voltages vary symmetrically with respect to the intermediate voltage VCC/2 as its center. For this reason, the non-selected word lines or wells have less coupling noise capacitively coupled with these voltages, since the coupling of the data-line pairs D0$b$ and D0$t$, D2$b$ and D2$t$, . . . and the coupling of the data-line pairs D1$b$ and D1$t$, D3$b$ and D3$t$, . . . cancel each other. Meanwhile, the voltage change of the storage node in the selected memory cell also varies substantially symmetrically with respect to the intermediate voltage VCC/2 as its center, the voltage change of the plate is small. For this reason, the voltage applied to the ferroelectric capacitor will not become small. When amplified by the sense amplifier, one of the data lines of the data-line pairs D0$b$ and D0$t$, D2$b$ and D2$t$, . . . is charged to VCC so that the voltage thereof changes largely; whereas, the other of the data lines of the data-line pairs D1$b$ and D1$t$, D3$b$ and D3$t$, . . . is discharged to VSS so that the voltage thereof changes largely. That is, even at this time, the voltage varies symmetrically with respect to the intermediate voltage VCC/2 as its center. Accordingly, the node capacitively coupled with the data-line pair is small. There is no possibility that the non-selected word lines are boosted through the coupling. As mentioned above, in the present embodiment, the voltages of the data-line pairs vary symmetrically with respect to the intermediate voltage VCC/2 as its center, with the result that its array noise becomes small as in the VCC/2 precharge scheme widely used in DRAM.

Various modification examples and application examples will be explained in the following.

Figure 4:
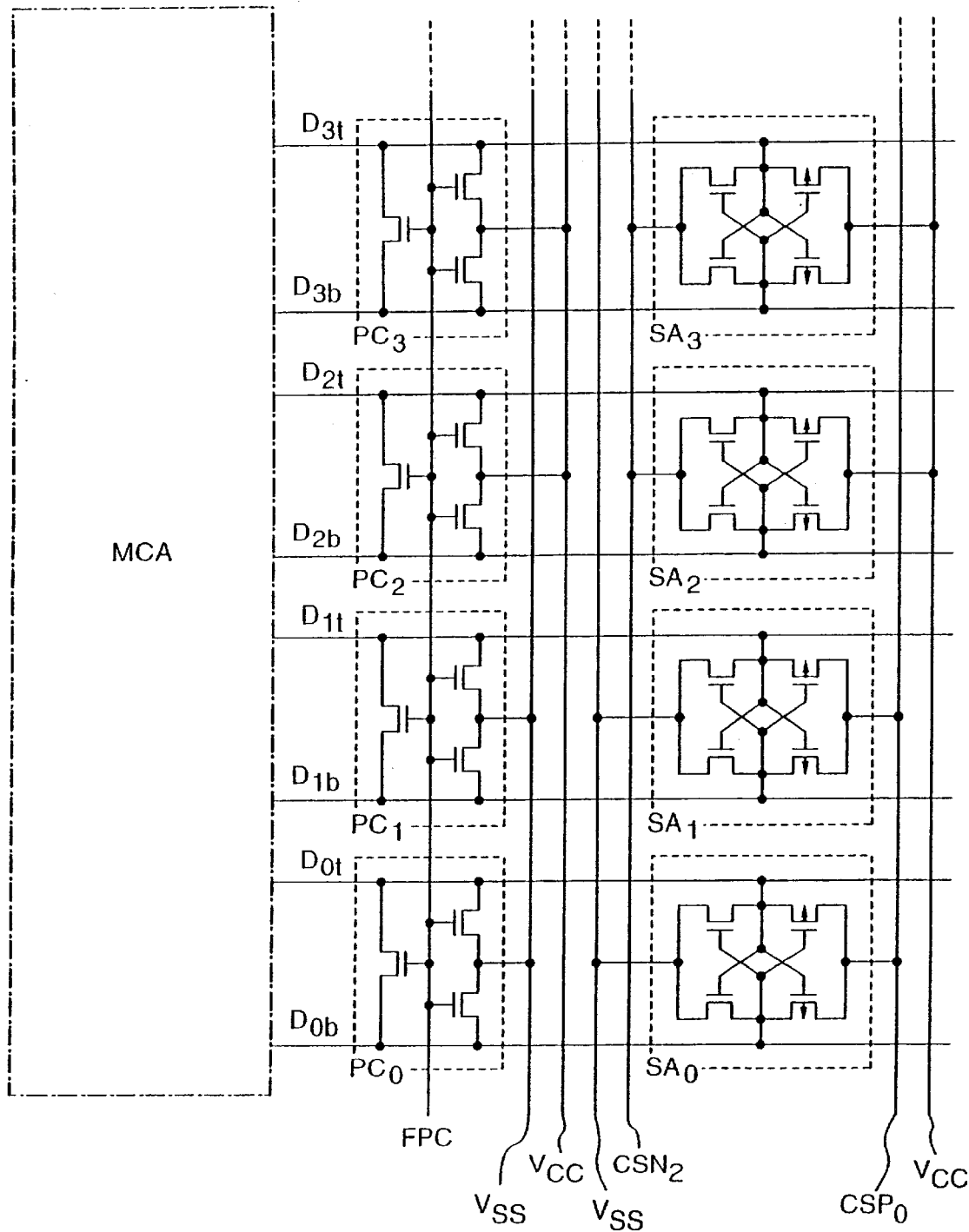
FIG. 4 is an exemplary arrangement which data-line pairs are grouped for every 2 pairs with respect to precharge voltages.
Figure 5:
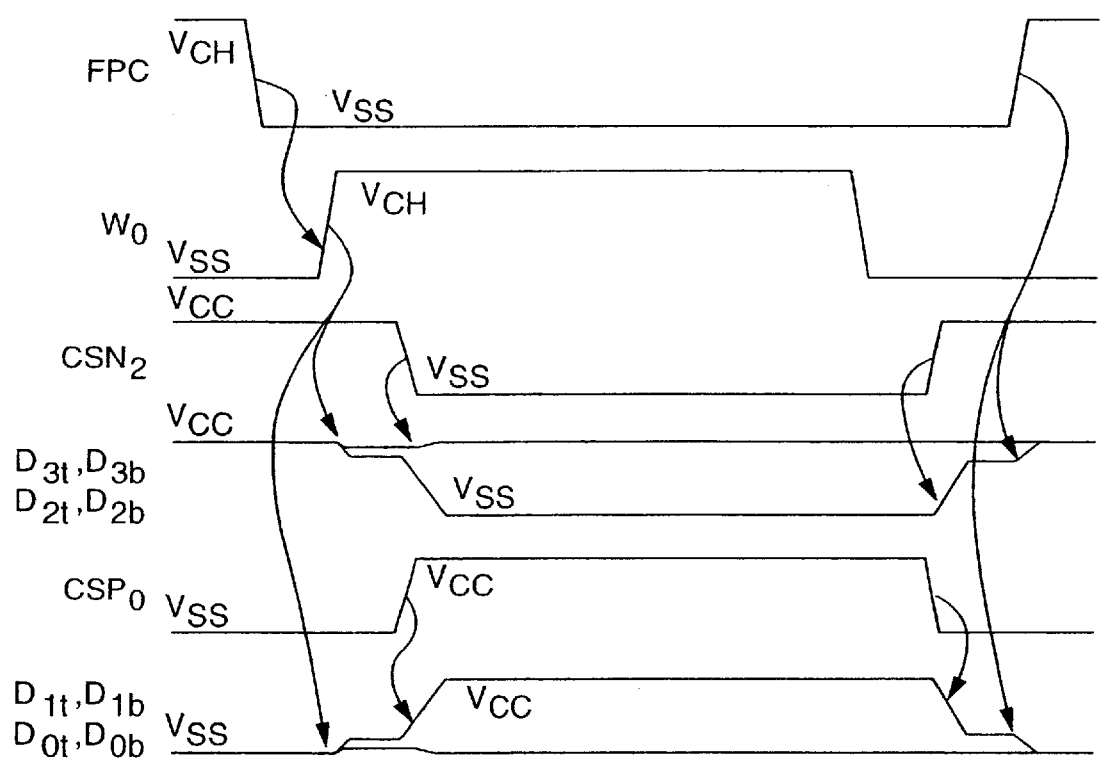
FIG. 5 is an operational timing chart when the precharge voltages of the data-line pairs are grouped for every 2 pairs.

FIG. 4 shows an example of arrangement when the data-line pair is precharged alternately to VSS and VCC for every 2 pairs. As in the exemplary arrangement shown in FIG. 1, the precharge circuits PC0, PC1, . . . and the sense amplifiers SA0, SA1, . . . are connected to the data-line pairs D0$b$ and D0$t$, D1$b$ and D1$t$, . . . respectively. The ground voltage VSS is supplied to the precharge circuits PC0 and PC1, while the source voltage VCC is supplied to the precharge circuits PC2 and PC3. Sources of NMOS transistors in the sense amplifiers SA0, SA1, . . . are connected to the ground voltage VSS, while sources of PMOS transistors in the sense amplifiers SA2, SA3, . . . are connected to the source voltage VCC. The interconnections of the precharge circuits and sense amplifiers are repeated on every 4 circuit or amplifier basis. As in FIG. 1, I/O lines and I/O gates for data transfer to external are omitted in the drawing. Its operational timing shown in FIG. 5 is similar to the operational timing shown in FIG. 3, except that the sense amplifier driving line CSN2 is driven like the sense amplifier driving line CSN1 in FIG. 2. The voltage of the data-line pairs is precharged alternately to VSS and VCC on every 2 pair basis. As a result, as viewed from the entire array, the voltage of the data-line pairs varies symmetrically with respect to the intermediate voltage VCC/2 as its center with less array noise.

With this exemplary arrangement, each two of the precharge circuits and sense amplifiers are connected to the same node. For this reason, the connection from a control line to the MOS transistors can be commonly realized, thus facilitating its layout. Further, such an arrangement may also be employed that the precharge voltage is switched on every 4 or 8 pair basis. In the case that the plate or non-selected word line where coupling noises are generated in the prior art arrangement has a high resistance, however, it is desirable to switch the precharge voltage finely on every pair or two pair basis. It is because the noise becomes larger as the data lines having symmetrically varying voltages are positioned more apart therefrom.

Figure 6:
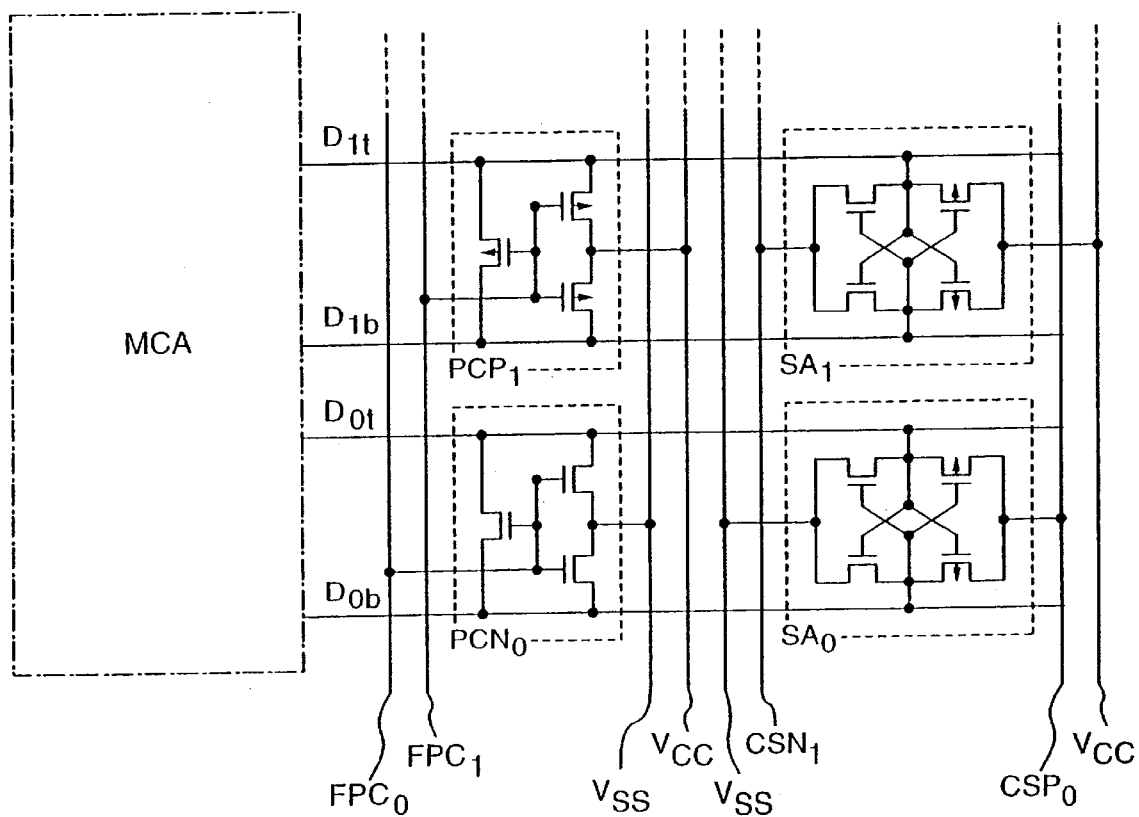
FIG. 6 shows an exemplary structure of a precharge circuit using CMOSs.
Figure 7:
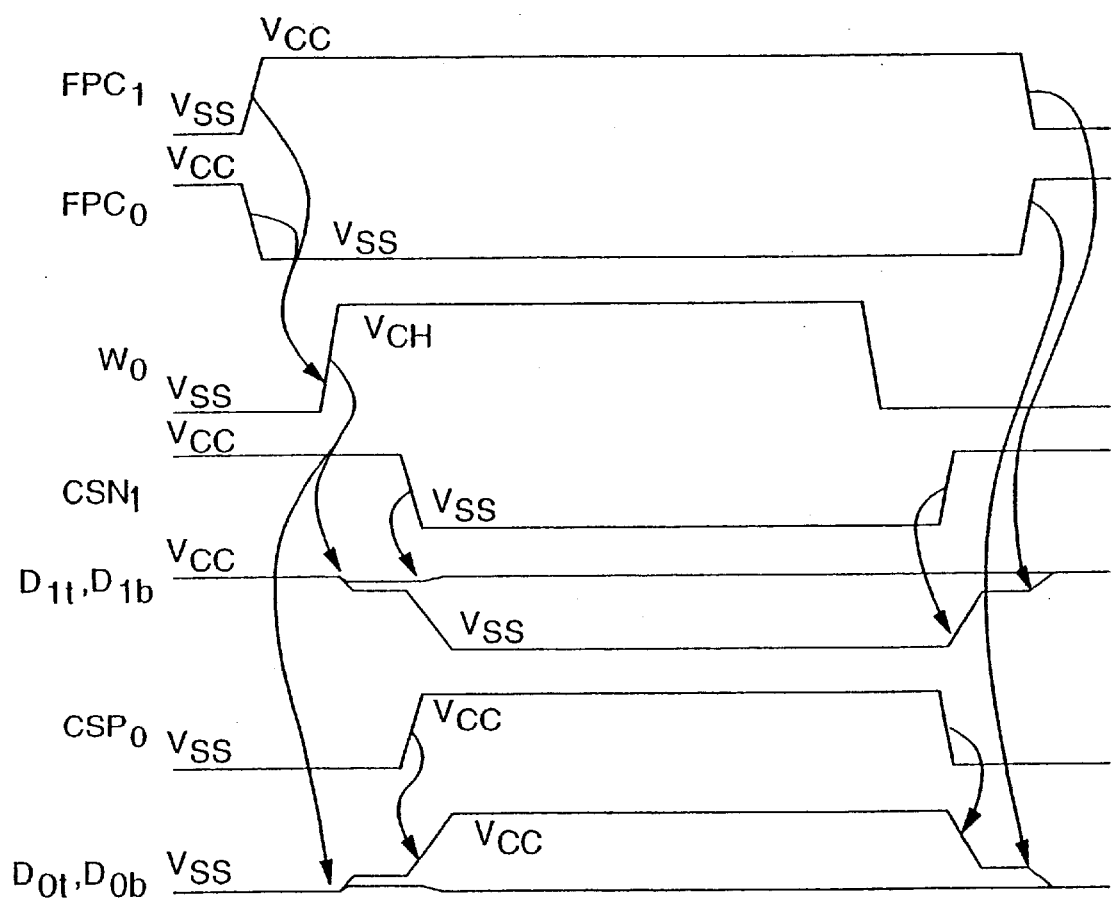
FIG. 7 is an operational timing chart of the exemplary structure of the precharge circuit using CMOSs.

FIG. 6 shows an exemplary arrangement when the data-line pair is precharged to the source voltage VCC with use of a precharge circuit of PMOS transistors. More specifically, a precharge circuit PCN0 made up of NMOS transistors is connected to the data-line pair D0$b$ and D0$t$, and the ground voltage VSS is supplied to the circuit PCN0. On the other hand, a precharge circuit PCP1 made up of PMOS transistors is connected to the data-line pair D1$b$ and D1$t$, and the source voltage VCC is supplied to the circuit PCP1. NMOS transistors in a sense amplifier SA0 connected to the data-line pair D0$b$ and D0$t$ are connected at their sources to the ground voltage VSS; and PMOS transistors in the sense amplifier SA1 are connected at their sources to the source voltage VCC. The structure and interconnection of the precharge circuits and sense amplifiers are repeated on every two circuit/two amplifier basis. As in FIG. 1, I/O lines and I/O gates for data transfer to external devices are omitted in the drawing. Its operational timing shown in FIG. 7 is similar to the operational timing shown in FIG. 3, except that the voltage of a control signal FPC0 of the precharge circuits varies from the source voltage VCC down to the ground voltage VSS and that a control signal FPC1 is a complementary form of the control signal FPC0. The voltage of the data-line pairs is precharged alternately to VSS and VCC on every pair basis, with a small array noise as in the arrangement of FIG. 1.

Since the source voltage VCC is supplied from the precharge circuit PC using the PMOS transistors, the precharge circuit can have a resistance smaller than that of the precharge circuit using the NMOS transistors, whereby the precharging rate can be speeded up and a cycle time can be shortened. Further, since it becomes unnecessary to use the word voltage VCH as the control signal of the precharge circuit, the charge-pump ability of the boosting circuit can be lightened when it is desired to boost the source voltage VCC to supply the voltage VCH.

Figure 8:
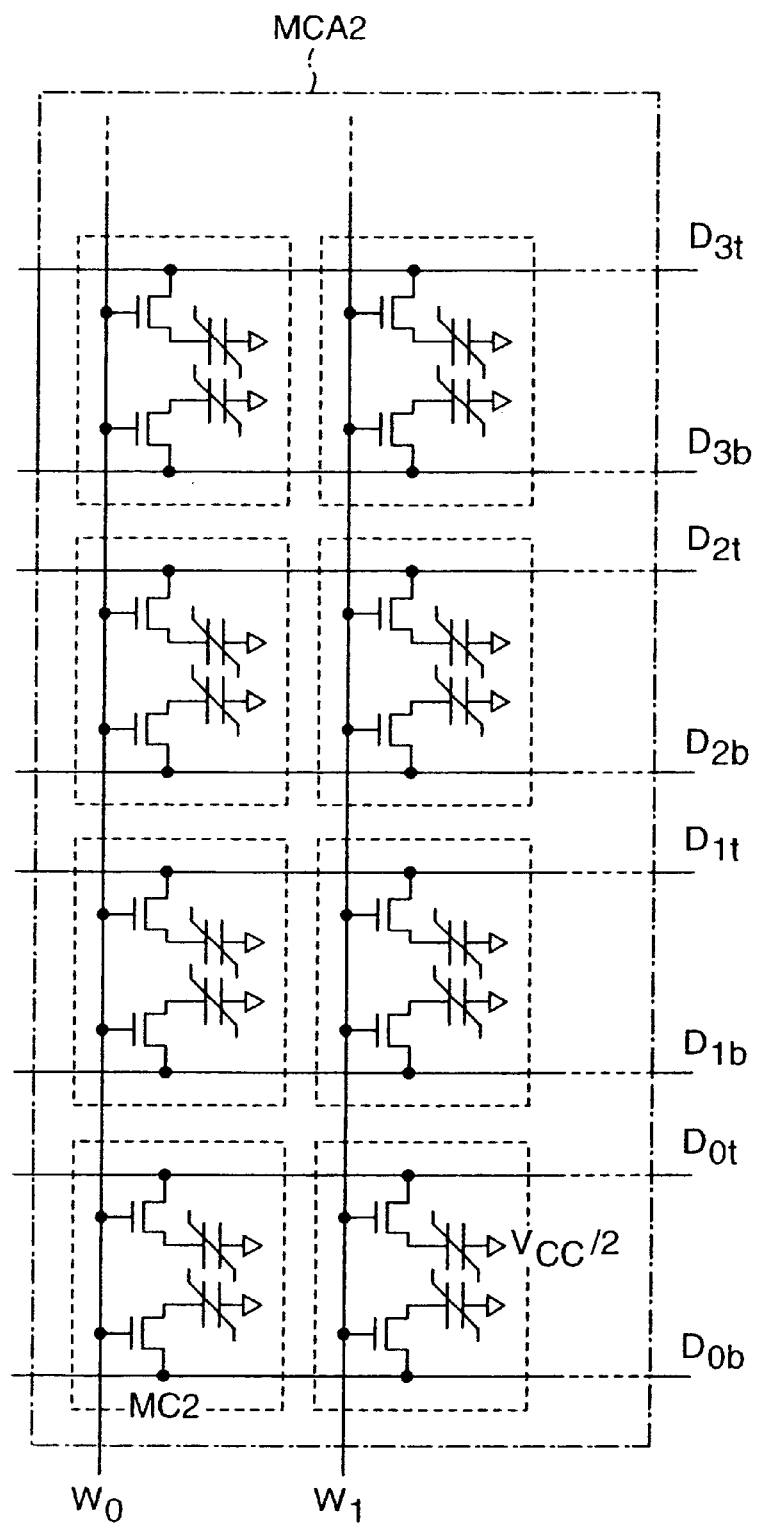
FIG. 8 shows another exemplary arrangement of the memory array.

FIG. 8 shows another exemplary arrangement of the memory cell array as a memory cell array MCA2. The memory cell array MCA2 can be used in place of the memory cell array MCA in FIG. 1. A memory cell MC2 in the memory cell array MCA2 is positioned at an intersection of word lines W0, W1, . . . and data-line pairs D0$b$ and D0$t$, D1$b$ and D1$t$, . . . The memory cell MC2 is made up of two ferroelectric capacitors and two NMO transistors. Data is complementarily stored in the two ferroelectric capacitors as remanent polarization thereof. Similarly to the memory cell MC1 in FIG. 2, one electrodes of the ferroelectric capacitors are connected to the associated NMOS transistors, and the other electrodes (plate electrodes) thereof are connected to the node common to the plurality of memory cells to receive the intermediate voltage VCC/2. Operational control is carried out in such a manner as shown in FIG. 3 as in the case of using the memory cell array MCA1 of FIG. 2. With this memory cell array, since signals are read out to both of the data lines in pair, a mechanism for generating the reference signal can be made unnecessary, thus enabling the operation with a high S/N ratio.

Figure 9:
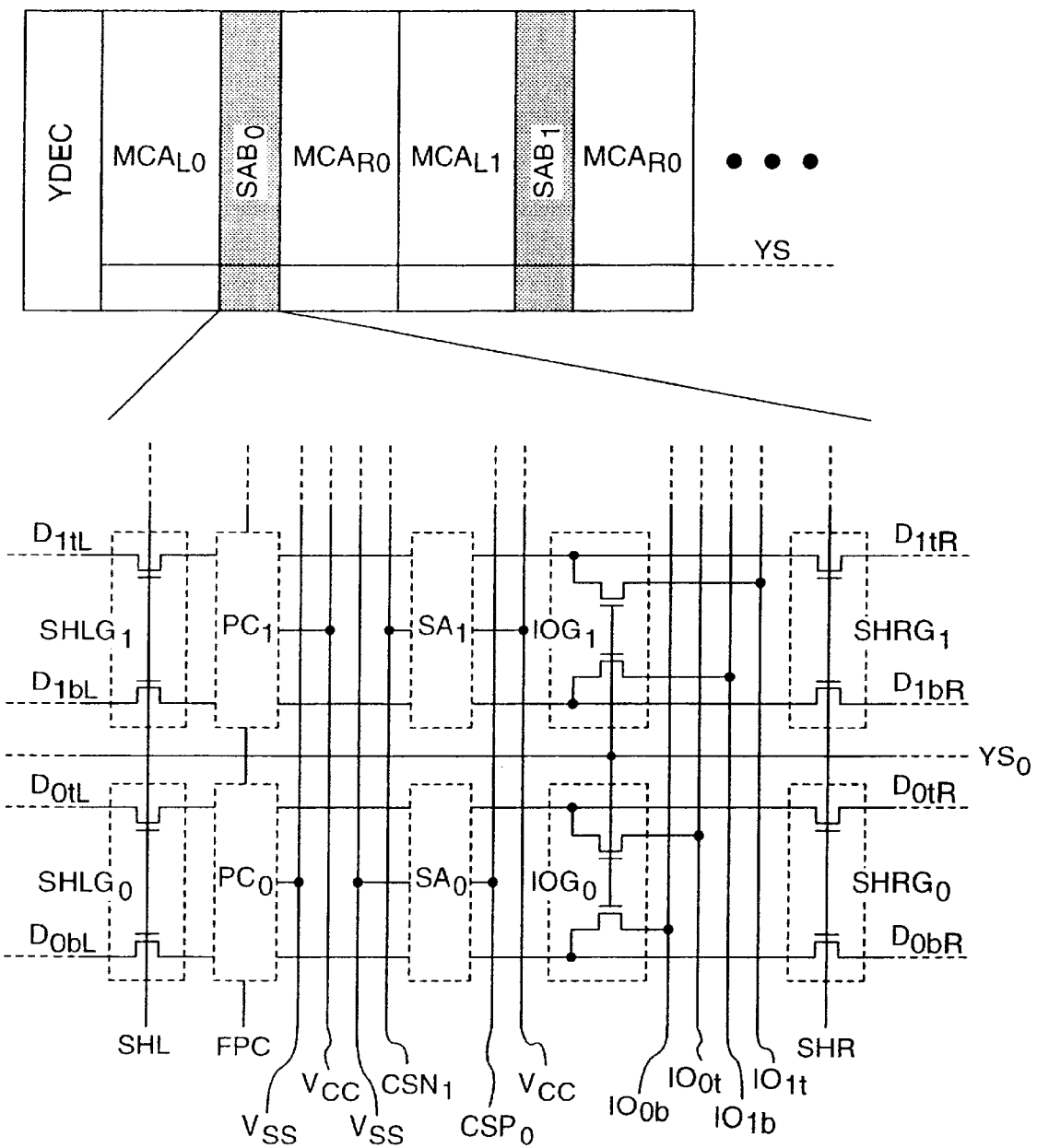
FIG. 9 shows an exemplary arrangement when a column decoder is shared by a plurality of memory arrays.

FIG. 9 shows an exemplary arrangement when a column decoder is commonly used in a plurality of memory cell arrays, featuring two sets of I/O lines according to the precharge voltage of the data-line pairs. In the drawing, reference symbols MCAL0 and MCAR0, MCAL1 and MCAR1, . . . denotes memory cell arrays which are each arranged, e.g., as shown by MCA1 in FIG. 1. Every two memory cell arrays share an amplifier part SAB0, SAB1, . . . which are each positioned between two memory cell arrays. Commonly provided to the pluralities of memory cell arrays and sense amplifier parts is a column decoder YDEC. A column select line YS is extended on the memory cell arrays. More specifically, each of the sense amplifier parts SAB0, SAB1, . . . is arranged as follows. Shared gates SHLG0, SHLG1, . . . are connected to data-line pairs D0$b$L and D0$t$L, D1$b$L and D1$t$L, . . . in the memory cell arrays MCAL0, MCAL1, . . . Shared gates SHRG0, SHRG1, . . . are connected to data-line pairs D0$b$R and D0$t$R, D1$b$R and D1$t$R, . . . in the memory cell arrays MCAR0, MCAR1, . . . The shared gate plays a role of selecting the left and right data line pairs. The precharge circuits PC0, PC1, . . . , sense amplifiers SA0, SA1, . . . , and I/O gates IOG0, IOG1, . . . are provided between the shared gates SHLG0 and SHRG0, SHLG1 and SHRG1, . . . The precharge circuits PC0, PC1, . . . and the sense amplifiers SA0, SA1, . . . have such a circuit configuration as shown in FIG. 1 respectively. The ground voltage VSS is supplied to the precharge circuit PC0 and the source voltage VCC is supplied to the precharge circuit PC1. NMOS transistors in the sense amplifier SA0 are connected at their sources to the ground voltage VSS, PMOS transistors in the sense amplifier SA1 are connected at their sources to the source voltage VCC. The I/O gate IOG0 is connected to I/O line pairs IO0$b$ and IO0$t$, and the I/O gate IOG1 is connected to I/O line pairs IO1$b$ and IO1$t$. A column select line YS0 is provided for two data-line pairs to control the I/O gates IOG0 and IOG1. The interconnection of the precharge circuits, sense amplifiers and I/O gates for a control signal, etc. is repeated for two of the precharge circuits, two of the sense amplifiers and two of the I/O gates.

Figure 10:
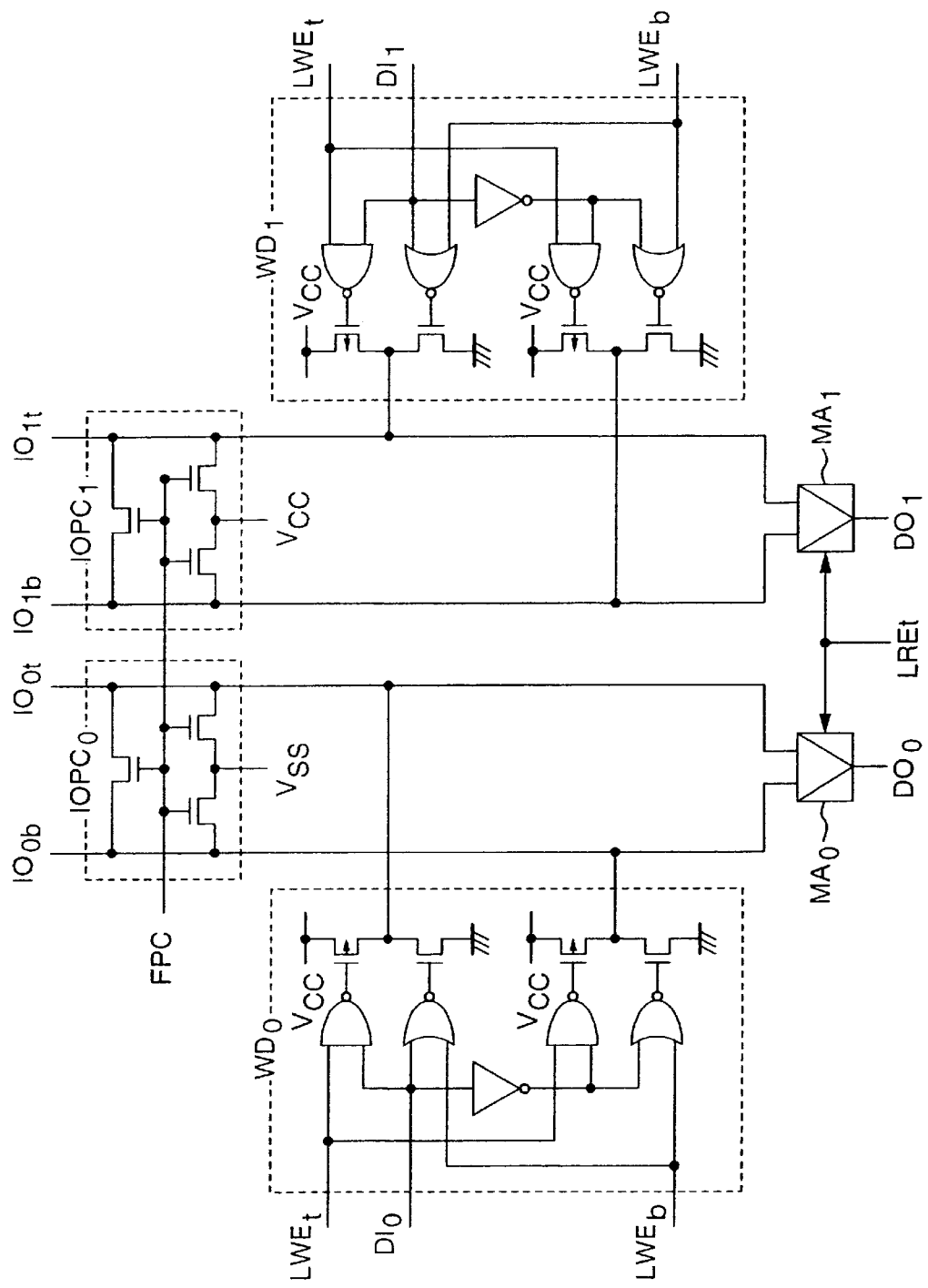
FIG. 10. shows an exemplary arrangement of a control circuit of I/O line pairs.

Connected to the I/O line pairs are such control circuits as shown in FIG. 10. The I/O line precharge circuits IOPC0 and IOPC1, write circuits WD0 and WD1, and main amplifiers MA0 and MA1 are connected to the I/O line pairs IO0$b$ and IO0$t$ and IO1$b$ and IO1$t$ respectively. The ground voltage VSS is supplied to the precharge circuit IOPC0, and the source voltage VCC is supplied to the precharge circuit IOPC1.

Figure 11:
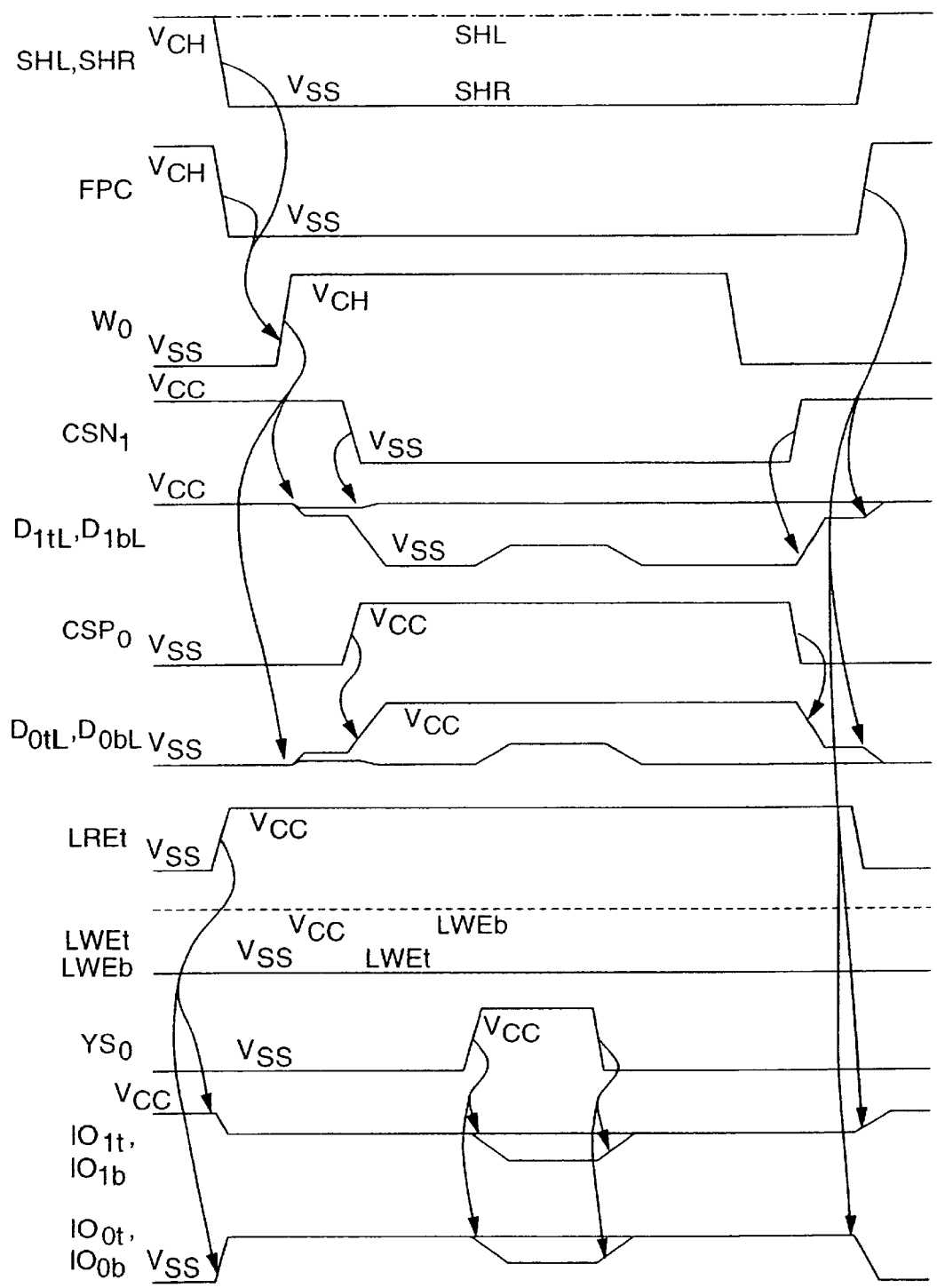
FIG. 11 is a read operation timing chart of the exemplary arrangement of FIG. 9.

The read operation of this arrangement will be explained with reference to a timing charge shown in FIG. 11. The drawing shows when the word line W0 is selected in the memory cell array MCAL0 to externally read signals detected by the sense amplifiers SA0 and SA1. In the standby state, the control signal FPC causes the BNIS transistors in the precharge circuits PC0, PC1, . . . and in the I/O line precharge circuits IOPC0 and IPOC1 to be put in their ON state. Further, the control signals SHL and SHR are both at VCH, such that NMOS transistors in the shared gates SHLG0, SHLG1, . . . and in the shared gates SHRG0, SHRG1, . . . to be put in their ON state. The data-line pairs D0$b$L and D0$t$L, D0$b$R and D0$t$R, . . . and the I/O line pair IO0$b$ and IO0$t$ are precharged to VSS, while the data-line pairs D1$b$L and D1$t$L, D1$b$R and D1$t$R, . . . and the I/O line pair IO1$b$ and IO1$t$ are precharged to VCC. The control signal SHR is set at VSS to turn OFF the NMOS transistors in the shared gates SHRG01 SHRG1, . . . , thereby separating the memory cell array MCAR0 from the sense amplifier part SAB0. Further, the control signal FPC causes turning OFF of the precharge circuits PC0, PC1, . . . as well as the I/O line precharge circuits IOPC0 and IOPC1. The data-line pairs D0$b$L and D0$t$L, D1$b$L and D1$t$L, . . . are floating. Meanwhile, the I/O line pairs IO0$b$ and IO0$t$, IO1$b$ and IO1$t$ have a bias voltage determined by input parts of the main amplifiers MA0 and MA1 when a local read-enable signal LREt is set at VCC. Thus, when the work line W0 is set at the selected-word-line voltage VCH, the memory cell MC1 is selected to read the signal to the data-line pair. And the sense amplifier driving lines CSP0 and CSN1 activate the sense amplifiers SA0, SA1, . . . , whereby one of the data-line pairs D0$b$L and D0$t$L, D1$b$L and D1$t$L, . . . is set at VCC and the other is set at VSS. In this case, the column select line YS0 is selected by the column decoder YDEC to turn ON the I/O gate IOG0 and to drive the I/O line pairs IO0$b$ and IO0$t$, IO1$b$ and IO1$t$ by the sense amplifiers SA0 and SA1. This is detected by the main amplifiers MA0 and MA1 and output to output terminals DO0 and DO1 of the main amplifiers, thus realizing the read operation. In this connection, by previously setting a local write-enable signal LWEt at VSS and local write-enable signal LWEb at VCC, the write circuits WDO and WD1 are put in their high-impedance state. And the column select line YS0 is lowered. When the word line WO is lowered, rewrite operation to the memory cell MC1 is carried out. Thereafter, the control signal CSP is set at VSS and the control signal CSN1 is returned to VCC to stop the operation of the sense amplifiers SA0, SA1, . . . The control signal FPC is then used to turn ON the precharge circuits PC0, PC1, . . . as well as the I/O line precharge circuit IOPC0 and IOPC1. And the control signal SHR is used to turn ON the NMOS transistors in the shared gate SHRG0, to couple the memory cell array MCAR0 with the sense amplifier part SAB0, thus returning it to the standby state.

Figure 12:
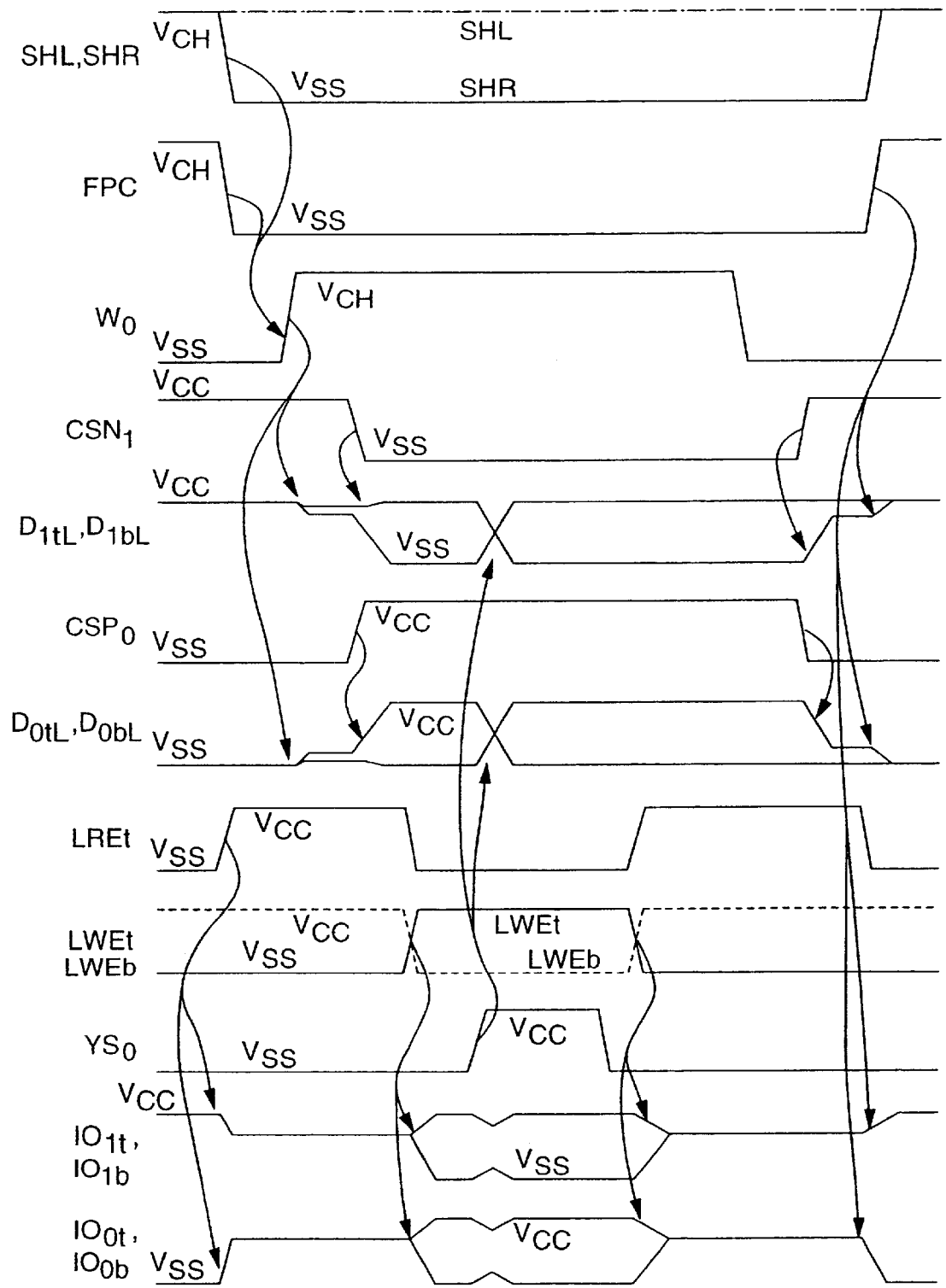
FIG. 12 is a write operation timing chart of the exemplary arrangement of FIG. 9.

Explanation will next be made as to the write operation with use of a timing chart shown in FIG. 12. The drawing shows when the word line W0 is selected in the memory cell array MCAL0 to write a signal from the data-line pairs D0$b$L and D0$t$L, and D1$b$L and D1$t$L. The write operation until the signal on the data-line pairs is detected is the same as the read operation shown in FIG. 11. The local write-enable signal LWEt is set at VCC and the local write-enable signal LWEb is set at VSS to activate the write circuits WD0 and WD1, whereby the I/O line pairs IO0$b$ and IO0$t$, and IO1$b$ and IO1$t$ are driven according to input signals DI0 and DI1. In this case, the local read-enable signal LREt is set at VSS to stop the operations of the main amplifiers MA0 and MA1. The column select line YS0 is selected by the column decoder YDEC to turn ON the I/O gate IOG0, whereby the I/O line pairs IO0$b$ and Ioot, and IO1$b$ and IO1$t$ are coupled with the sense amplifiers SA0 and SA1 to put the amplifiers in a state corresponding to the write signal, thus realizing the write operation. FIG. 12 shows when the sense amplifiers SA0 and SA1 are both inverted. And the column select line YS0 is lowered and the word line W0 is also lowered to be returned to their standby state.

With the arrangement shown in FIG. 9, since the sense amplifier part is shared by its left and right memory cell arrays, an area of the sense amplifier part can be reduced. Further, by sharing the column decoder by the plurality of sense amplifier parts, an area of the column decoder can be reduced. In this case, it is desirable to activate only a desired sense amplifier part according to an address signal externally input and to maintain the non-selected sense amplifier part in the standby state. In this case, the I/O gate is turned ON by the column select line even for the non-selected sense amplifier part, so that the sense amplifier is coupled with the I/O line pair. When a separate pair of I/O lines are provided for each precharge voltage as shown in FIG. 9, the I/O line pair and data-line pair possibly coupled with each other can be previously precharged to the same voltage, thus enabling prevention of an unnecessary current from flowing therethrough.

Figure 13:
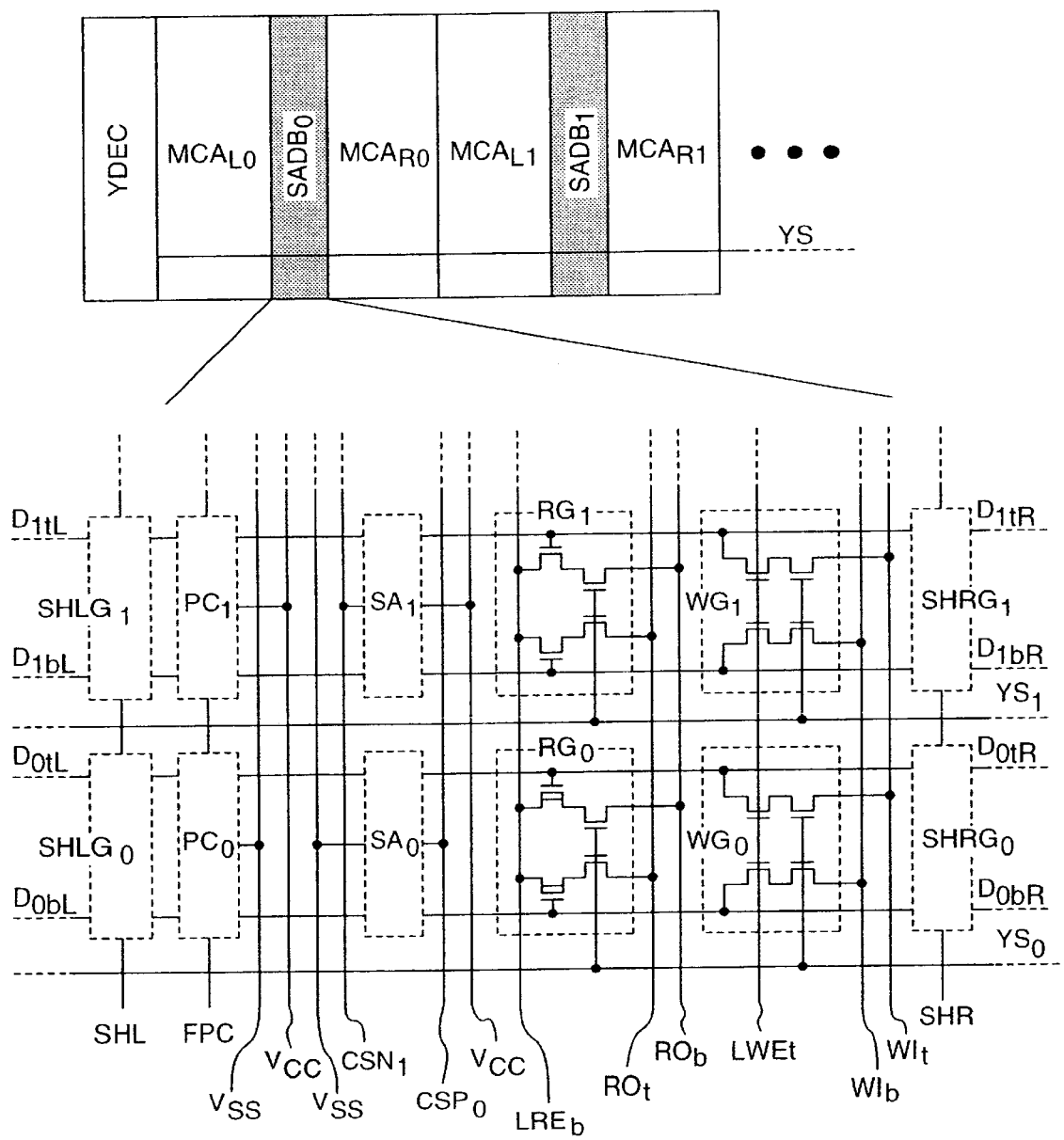
FIG. 13 shows an exemplary arrangement when the input-line pairs are separated from the output-line pairs.

FIG. 13 shows another exemplary arrangement when a column decoder is shared by a plurality of memory cell arrays. This arrangement is featured in that the common I/O line pair in the exemplary arrangement of FIG. 9 is separated into an input line pair and an output line pair. As in the exemplary arrangement shown in FIG. 9, sense amplifier parts SADB0, SADB1, . . . are located between two's of memory cell arrays MCAL0 and MCAR0, MCAL1 and MCAL1, . . . and shared thereby; and thus the column decoder YDEC is commonly provided to the pluralities of memory cell arrays and sense amplifier parts. Details of the sense amplifier parts SADB0, SADB1, . . . are arranged as follows. Provided between the shared gates SHLG0 and SHRG0, SHLG1 and SHRG1, . . . are precharge circuits PC0, PC1, . . . , sense amplifiers SA0, SA1, . . . , read gates RG0, RG1, . . . , and write gates WG0, WG1, . . . The read gates RG0, RG1, . . . are connected to the output line pair ROb and Rot, and the write gates WG0, WG1, . . . are connected to I/O line pair WIb and Wit. In the read gate RG0, NMOS transistors connected at their sources to the control signal LREb are of a depletion type. The interconnection of the precharge circuits and sense amplifiers to the control signal, etc. is repeated on a two-circuit and two-amplifier basis, but the interconnection of the read and write gates is commonly used regardless of the precharge voltage. The column select lines YS0, YS1, . . . are provided for each pair of data lines.

Figure 14:
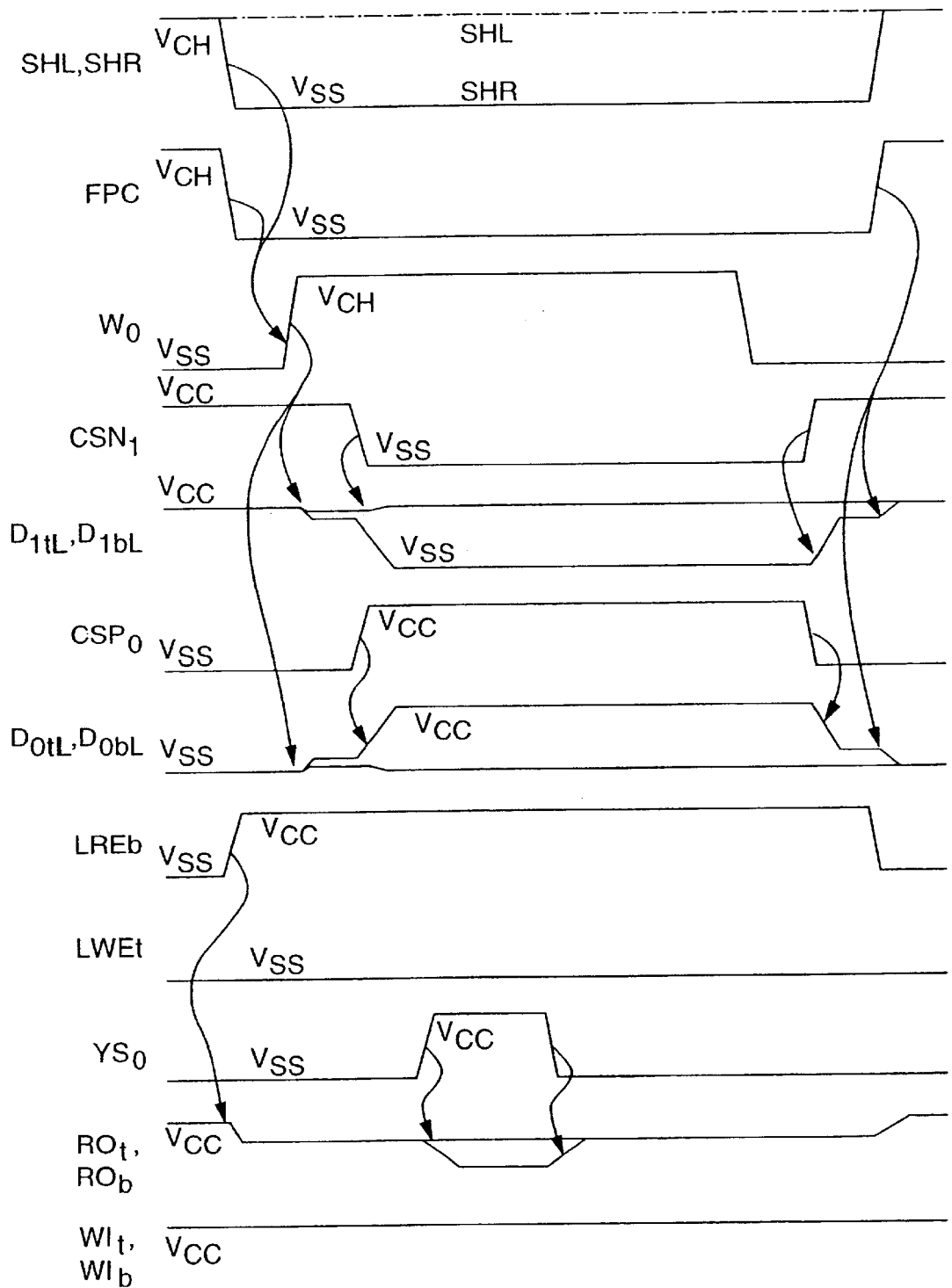
FIG. 14 is an operational timing chart of the exemplary arrangement of FIG. 13.
Figure 15:
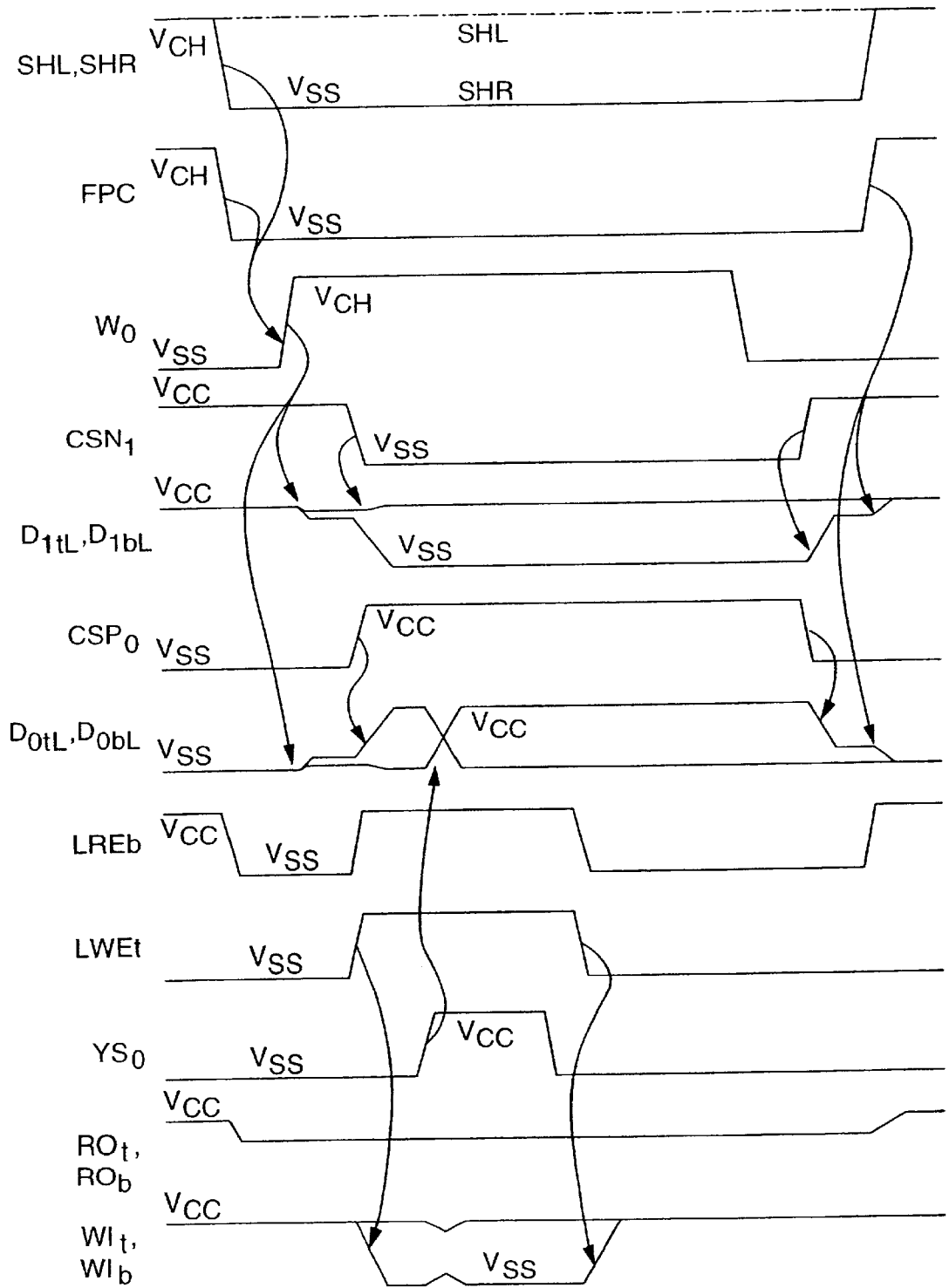
FIG. 15 a write operation timing chart of the exemplary arrangement of FIG. 13.

Timing charges of the read and write operations are shown in FIGS. 14 and 15, respectively. The drawings show when the word line WO in the memory cell array MCAL0 is selected to read or write a signal from or in the data-line pair D00$t$L and D0$b$L. These timing charges are the same as the timing charges of FIGS. 11 and 12 up to detection of the signal on the data-line pair by the sense amplifier and setting of the column select line at VSS, but are different in the timing of driving the column select line. As explained in IEEE Journal of Solid-State circuits, Vol. 26, No. 4, pp. 465–472, April, 1991, with regard to DRAM, a so-called direct sense scheme of separating input line pairs from output line pairs to drive a column select line before activating a sense amplifier can be employed to shorten an access time. The data-line pair D0$t$L and D0$b$L is previously precharged to VSS, but when a depletion type of NMOS transistors are used in the read gate RG0, the signal can be transmitted to the output-line pair before being amplified by the sense amplifier.

With this arrangement, the non-selected sense amplifiers are not coupled with the input or output line pair and it is only required to use one input line pair and one out line pair.

Figure 16:
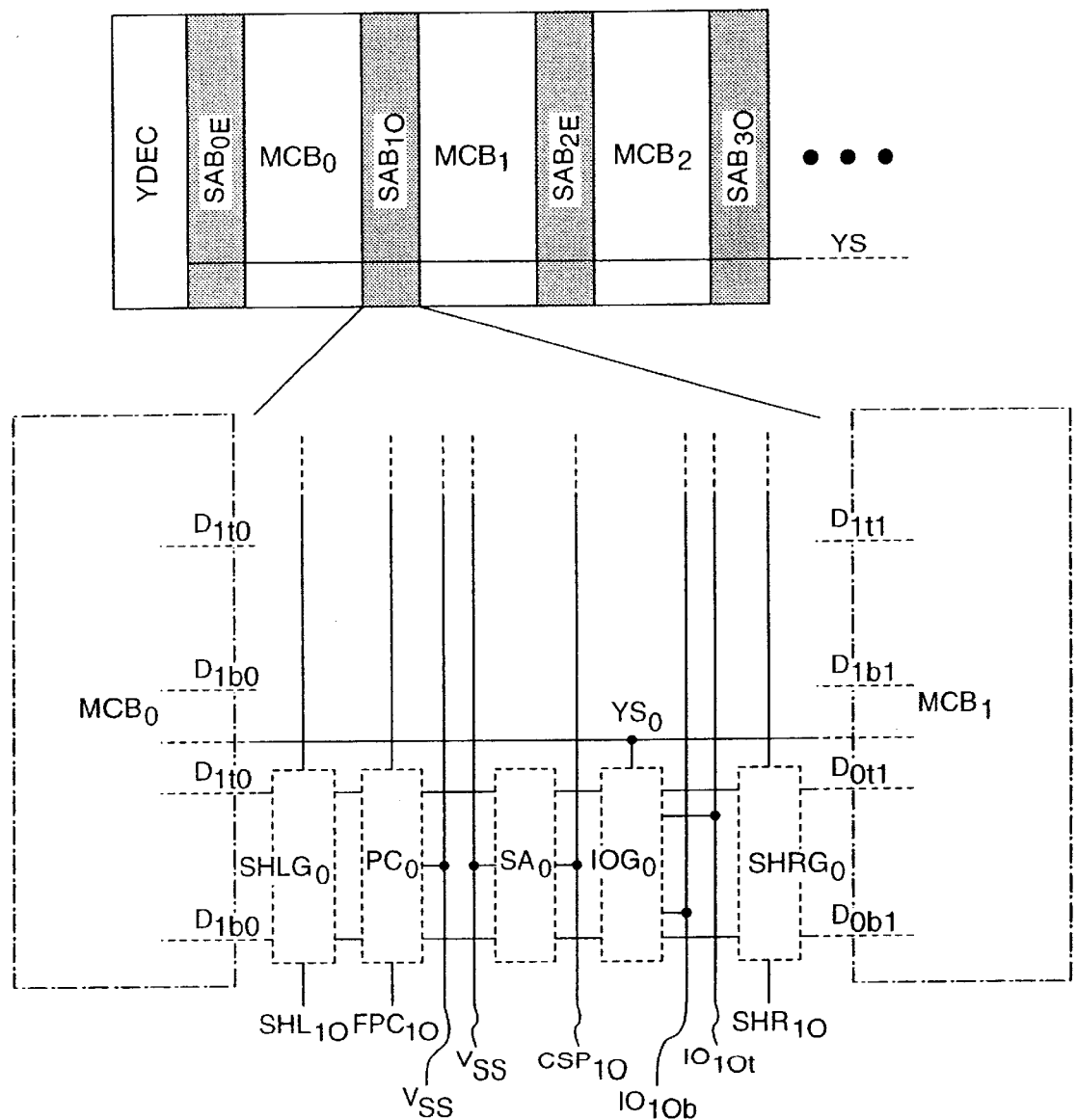
FIG. 16 shows a part of an exemplary arrangement when sense amplifiers are positioned at both ends of a memory cell array.
Figure 17:
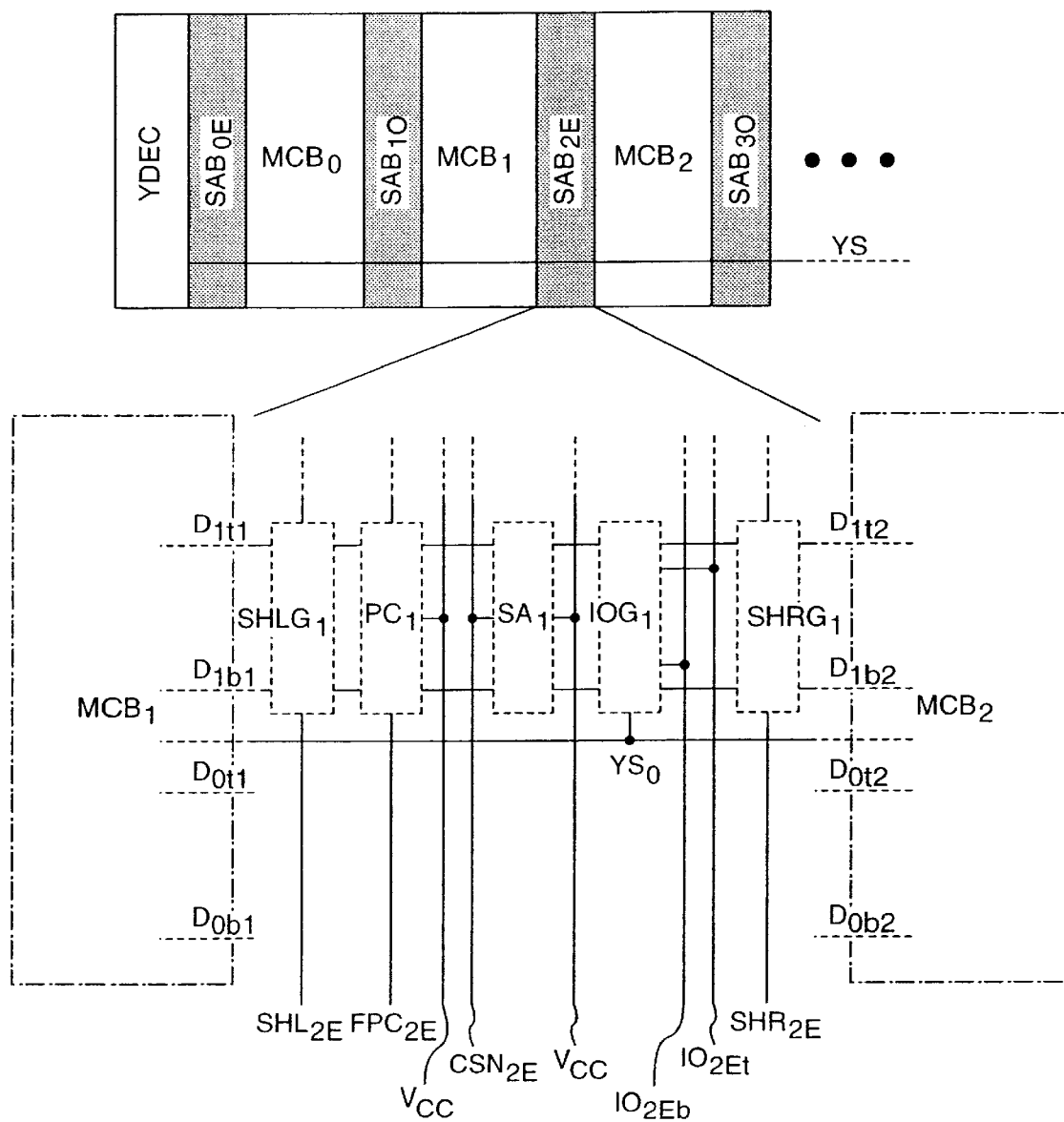
FIG. 17 shows a continuation from the exemplary arrangement when sense amplifiers are positioned at both ends of a memory cell array.

FIGS. 16 and 17 shows an exemplary arrangement when a sense amplifier is positioned at both sides of each of memory cell arrays. The arrangement is featured in that different precharge voltages are used for different sense amplifier parts. Reference symbols MCB0, MCB1, MCB2, . . . denote memory cell arrays, which are each arranged, for example, as MCA1 in FIG. 2. Every two memory cell arrays share a sense amplifier part SAB0E, SAB1O, SAB2E, SAB3O, . . . which are each provided between the two memory cell arrays, while the sense amplifier parts provided at both sides of each memory cell array perform sensing operation. A column decoder YDEC is provided commonly to the pluralities of memory cell arrays and sense amplifier parts, and column select lines YS (such as YS0) are extended on the memory cell arrays. The interconnection of the sense amplifier parts is repeated on every two part basis. The sense amplifier part SAB1O is arranged as shown in FIG. 16 and is connected to 0-th, second, . . . data line pairs in the memory cell arrays MCB0 and MCB1. Meanwhile, the sense amplifier part SAB2E is arranged as shown in FIG. 17 and is connected to first, third, . . . data line pairs in the memory cell arrays MCB1 and MCB2. Reference symbols SHLG0, SHRG0, SHLG1 and SHRG1 denote shared gates, IOG0 and IOG1 denote I/O gates, each having such a circuit configuration as shown in FIG. 9. Further, reference symbols PC0 and PC1 denote precharge circuits, SA0 and SA1 denote sense amplifiers, each having such a circuit configuration as shown in FIG. 1.

Figure 18:
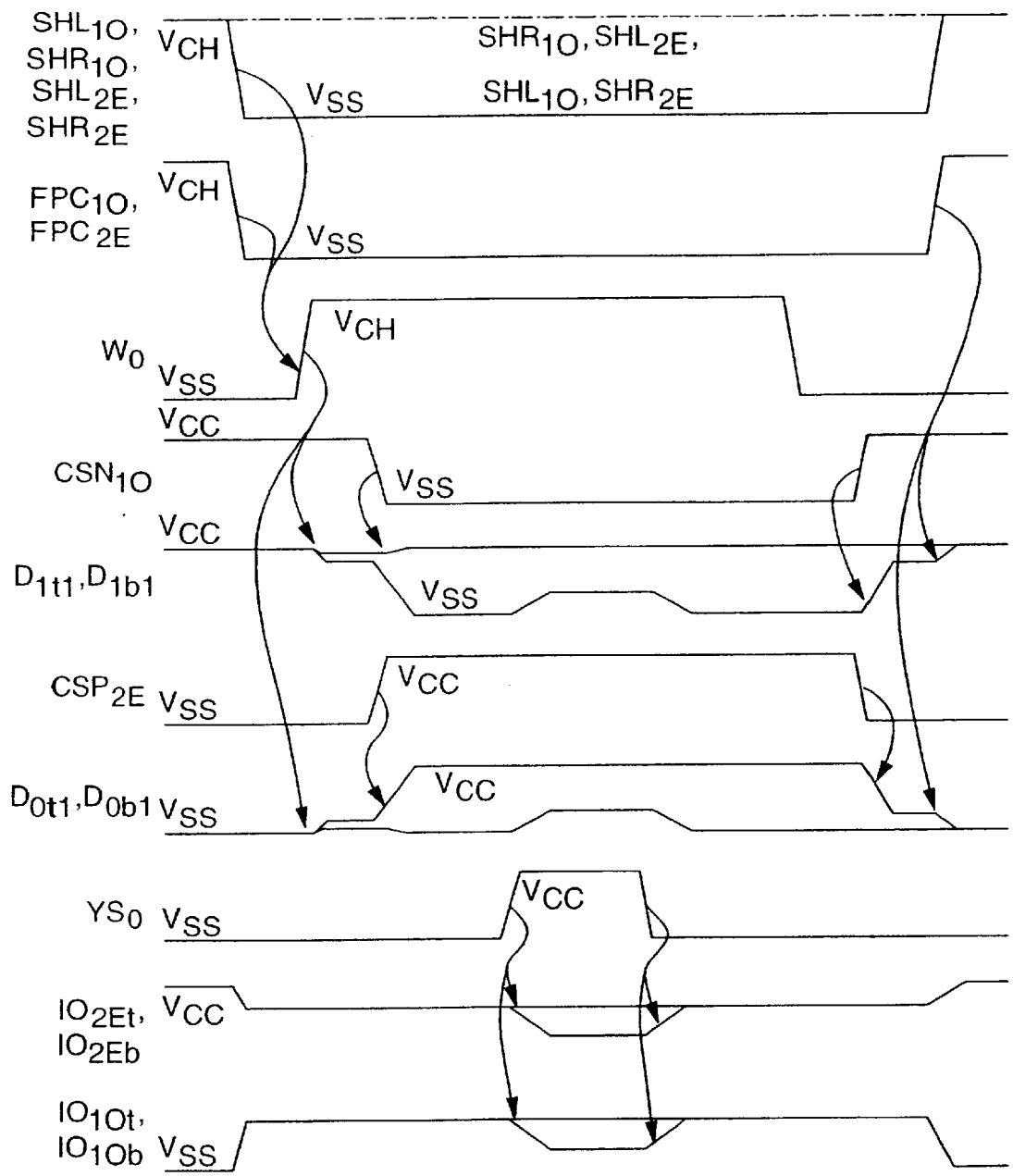
FIG. 18 is a read operation timing chart of the exemplary arrangement of FIGS. 16 and 17.
Figure 19:
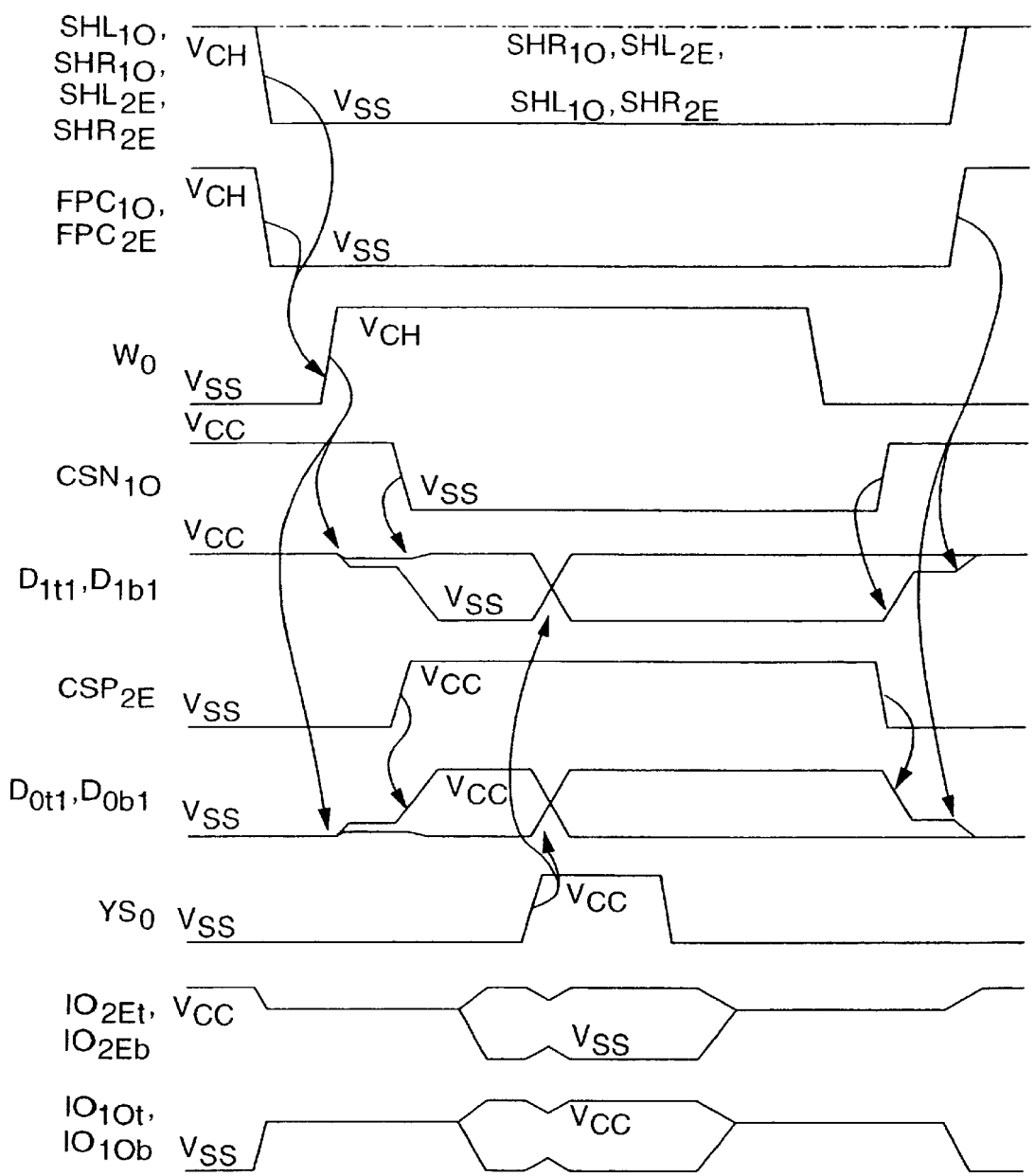
FIG. 19 is a write operation timing chart of the exemplary arrangement of FIGS. 16 and 17.

The read and write operations are carried out as shown in FIGS. 18 and 19 respectively. The drawings show when the word line W0 is selected in the memory cell array MCB1 to read or write a signal from or to the data-line pairs D0$t$1 and D0$b$1, and D1$t$1 and D1$b$1. The control signals SHL10 and SHR2E are set at VSS so that the shared gates SHLG0 and SHRG1 separate the memory cell array MCB0 from the sense amplifier part SAB1O and also the memory cell array MCB2 from the sense amplifier part SAB2E to perform operations similar to those shown in FIGS. 11 and 12.

As in this exemplary arrangement, when the sense amplifiers are alternately provided at both sides of each memory cell array, the layout pitch of the sense amplifiers can be mitigated to be doubled. Further, even when the precharge voltages for the data-line pairs in the memory cell array are grouped into two, one set of precharge voltage supply lines, one set of sense amplifier driving lines and one set of I/O line pairs are only required for each sense amplifier part, thus facilitating its layout. Furthermore, the layout of these control circuits can be facilitated.

Although each one pair of data lines has been connected to the left and right sense amplifier parts in this example, each plural pairs of data lines may be connected thereto.

[Second Embodiment]

Figure 20:
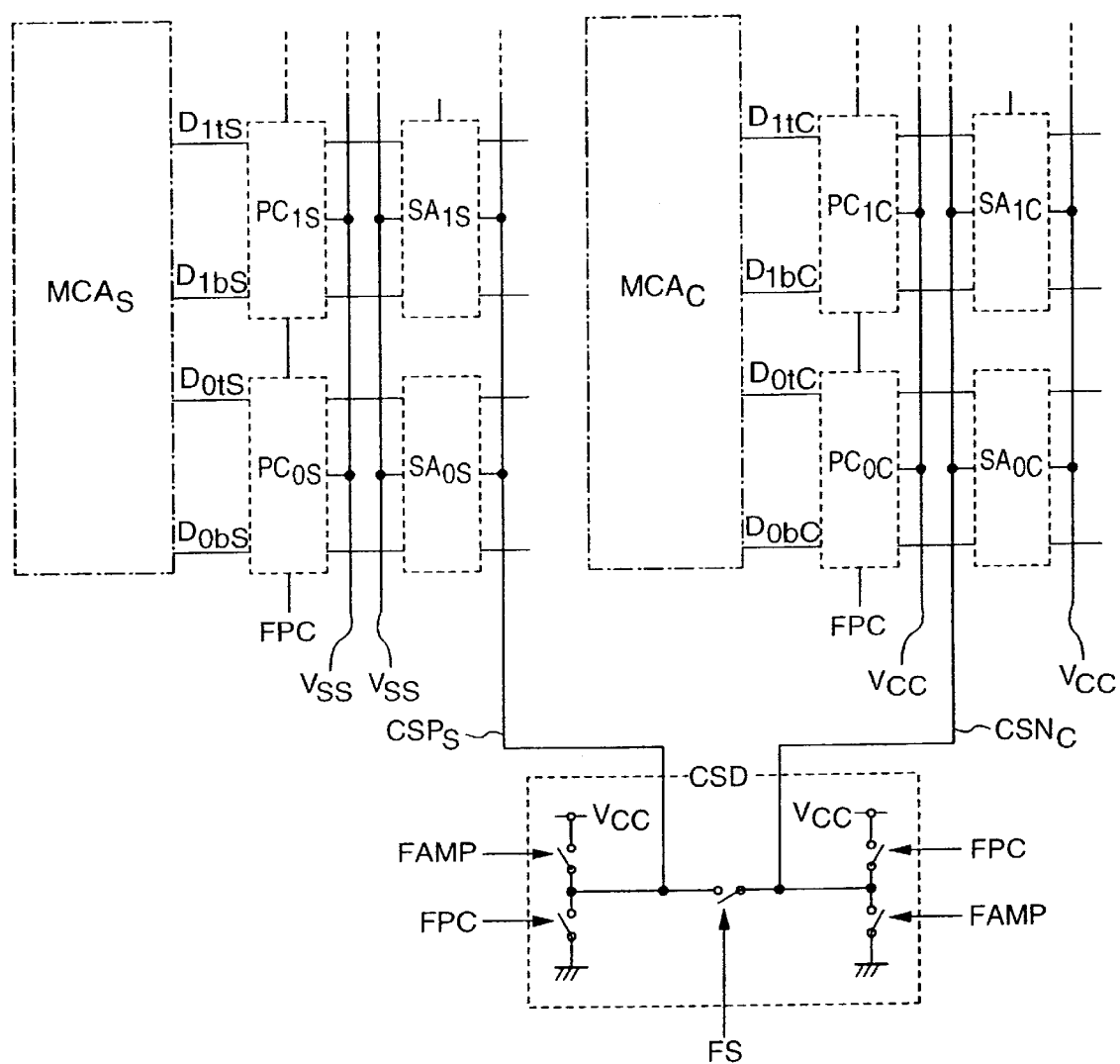
FIG. 20 shows an exemplary basic arrangement of a second embodiment.

An embodiment of realizing aforementioned second means will then be explained. A major part of its exemplary arrangement is shown in FIG. 20. This arrangement is featured in that charge transfer is carried out between the data-line pairs precharged to different voltages to perform sensing and precharging operations. Precharge circuits PC0S, PC1S, . . . and sense amplifiers SA0S, SA1S, . . . are connected to the data-line pairs D0$b$S and D0$t$S, D1$b$S and D1$t$S, . . . Meanwhile, the precharge circuits PC0C, PC1C, . . . and sense amplifiers SA0C, Sa1C, . . . are connected to the data-line pairs D0$b$C and D0$t$C, D1$b$C and D1$t$C, . . . The precharge circuits and sense amplifiers have such circuit arrangement as shown in FIG. 1. The ground voltage VSS is supplied to the precharge circuits PC0S and PC1S, the source voltage VCC is supplied to the precharge circuits PC0C and PC1C. NMOS transistors in the sense amplifiers SA0S, SA1S, . . . are connected at their sources to the ground voltage VSS, while PMOS transistors in the sense amplifiers SA0C, SA1C, . . . are connected at their sources to the source voltage VCC. For simplicity, I/O lines and I/O gates for data transfer to external devices are omitted in the drawing. Reference symbols MCAS and MCAC denote memory cell arrays, which are each arranged, for example, as shown by MCA1 in FIG. 2. Further, symbol CSD denotes a sense amplifier driving circuit, which performs charge transfer from or to the sense amplifiers SA0S, SA1S, . . . and SA0C, SA1C, . . . by means of switches provided in the circuit.

Figure 21:
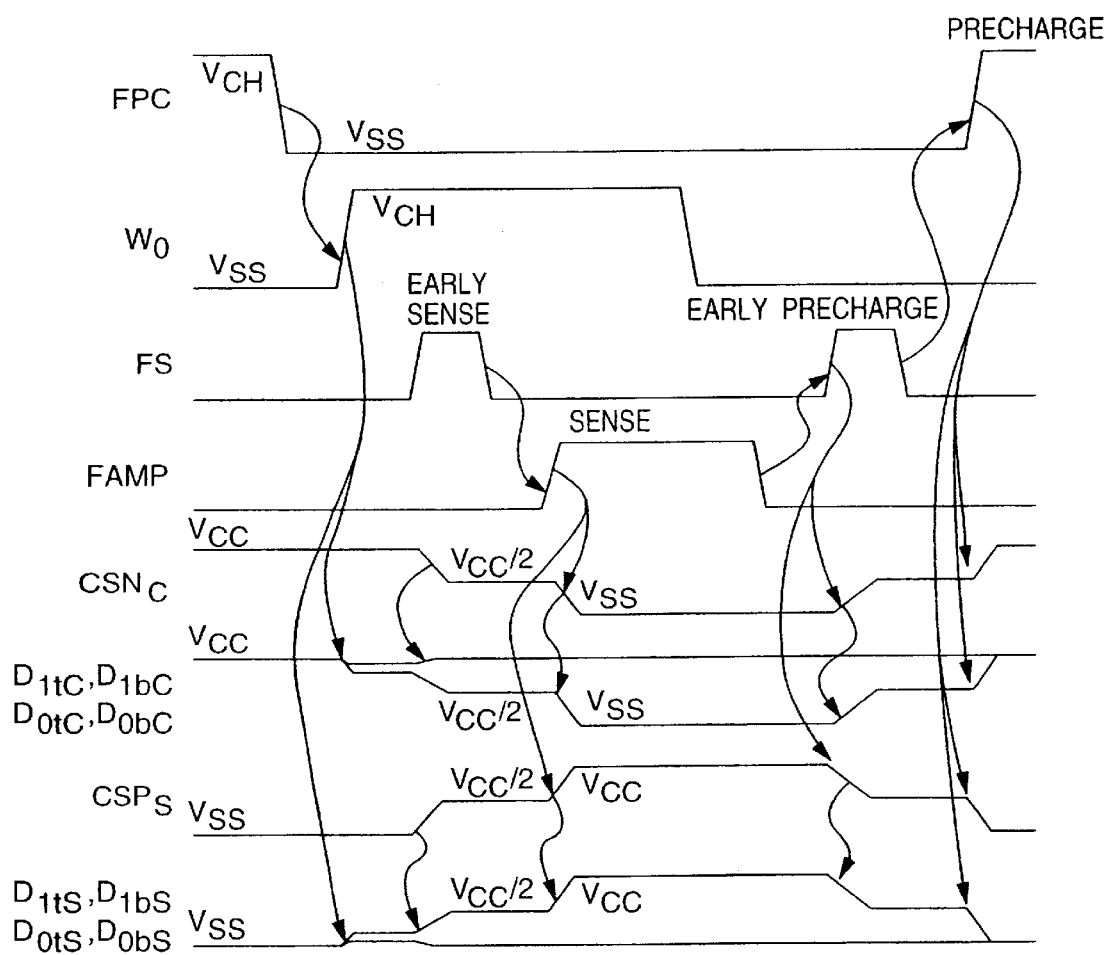
FIG. 21 is a basic operational timing chart of the second embodiment.

With this exemplary arrangement, the memory cell arrays MCAS and MCAC are both activated simultaneously. This operation will be explained by referring to a timing chart shown in FIG. 21. In the standby state, since the control signal FPC is set at VCH, the NMOS transistors in the precharge circuits PC0S, PC1S, . . . and PC0C, PC1C, . . .

are in their ON state, so that the data-line pairs D0*b*S and D0*t*S, D1*b*S and D1*t*S, . . . are precharged to VSS and the data-line pairs D0*b*C and D0*t*C, D1*b*C and D1*t*C, . . . are precharged to VCC. For operation, the control signal FPC causes the precharge circuits to be turned OFF. Thus, when the word line (W0 in FIG. 21) is set at the voltage VCH at the time of selection, the memory cell is selected and its remanent polarization is read out to the data line as charge. In this case, the control signal FS causes coupling between the sense amplifier driving lines CSPS and CSNC in the sense amplifier driving circuit CSD. This results in that charge transfer is carried out between the sense amplifiers SA0S, SA1S, . . . and SA0C, SA1C, . . . so that the sense amplifier driving lines CSPS and CSNC are set nearly at the intermediate voltage VCC/2. At this time, the sense amplifier differentially amplifies voltages on the data lines in each pair to perform its early sense operation. Next, a control signal FAMP causes the sense amplifier driving line CSPS to be set at VCC while the sense amplifier driving line CSNC to be set at VSS for sensing operation, whereby one of data lines in each pair is amplified to VSS and the other thereof is amplified to VCC. When the data is externally transferred under such a condition that the sense amplifier amplified the data, its read operation is carried out. When the voltage of the data line D is controlled according to data externally provided, write operation is carried out. After the word line W0 is lowered, the control signal FAMP causes the sense amplifier driving lines CSPS and CSNC to be floating. And again, the control signal FS causes coupling between the sense amplifier driving lines CSPS and CSNC. This results in that charge transfer is carried out between the sense amplifier SA0S, SA1S, . . . and SA0C, SA1C, . . . , the sense amplifier driving lines CSPS and CSNC to be set nearly at the intermediate voltage VCC/2, the high level of the data-line pairs D0*b*S and D0*t*S, D1*b*S and D1*t*S, . . . as well as the low level of the data-line pairs D0*b*C and D0*t*C, D1*b*C and D1*t*C, . . . are both set nearly at VCC/2, thus performing its early precharge operation. Next, the control signal FS causes separation between the sense amplifier driving lines CSPS and CSNC, and then the control signal FPC causes the sense amplifier driving line CSPS to be set at VSS, the sense amplifier driving line CSNC to be set at VCC and the precharge circuit to be turned ON, thus performing its precharge operation and returning it to the standby state.

Through the aforementioned operations, the earlier mentioned second problem can be solved in such a manner as to be explained below. Prior to the sense and precharge operations of coupling the sense amplifier driving line with the power source, the early sense and early precharge operations based on charge share are carried out. At this time, no charge transfer is carried out from or to the power source. Since nearly half of the sense and precharge operations are carried out based on the charge share, the amount of charge consumed for each data line pair is CD×VCC/2. Accordingly, power necessary for charge and discharge of the data lines is about half of the power necessary for the VSs precharge scheme of the prior art ferroelectric memory device and is equal to the power of the VCC/2 precharge scheme of DRAM.

Although the charge share between the sense amplifier driving lines has been used for both of the early sense and early precharge operations in this embodiment, it is possible to employ the charge share for only one of the operations. For example, when the charge share is used only for the early precharge operation, the effect of reducing the charge consumption drops to half but the delay of the sense operation becomes small.

Figure 22:
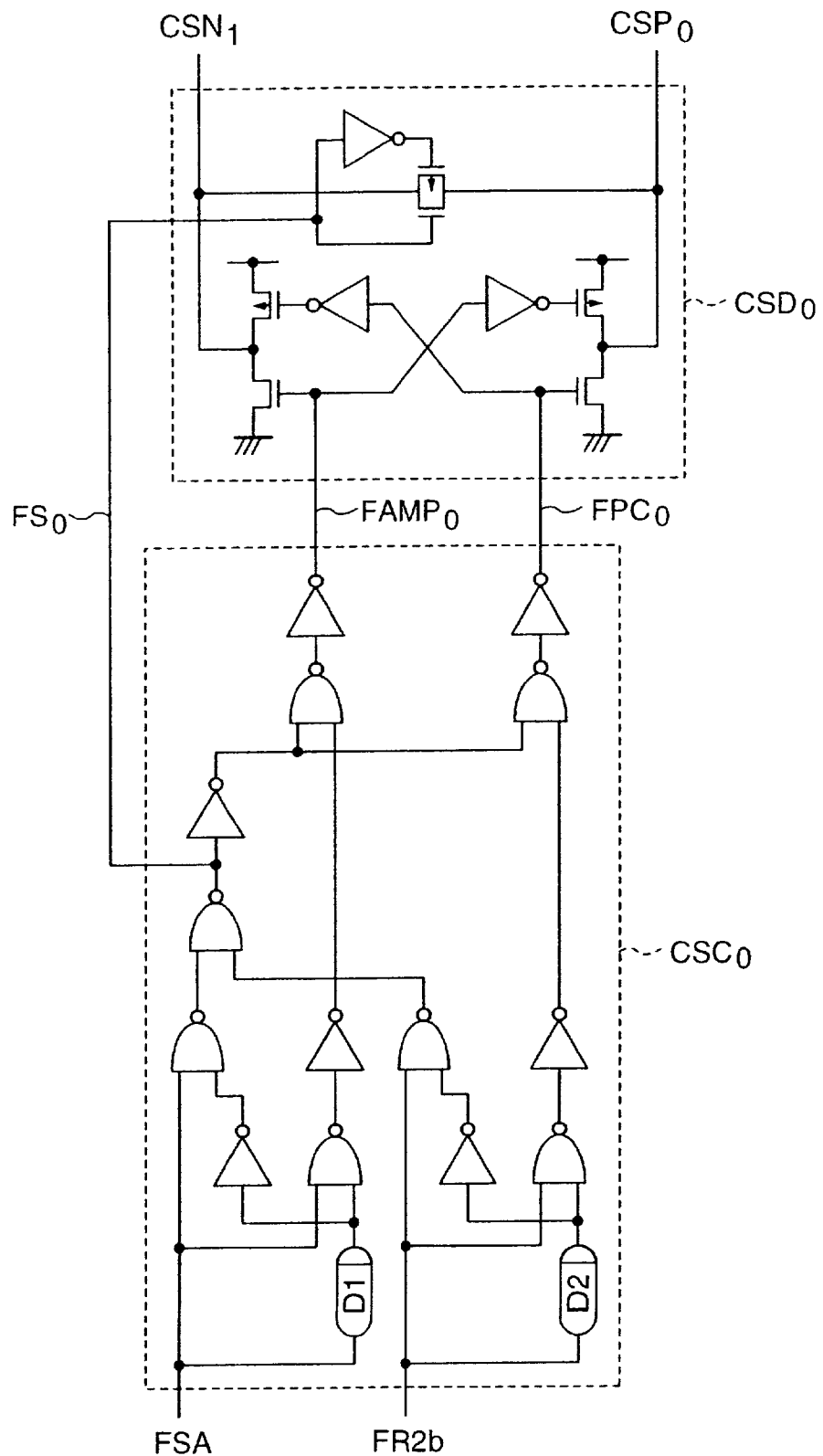
FIG. 22 shows an exemplary arrangement of a sense amplifier driving circuit and a control circuit.

FIG. 22 shows a detailed exemplary arrangement of a sense amplifier driving circuit and a control circuit. This arrangement is used as connected to the sense amplifier driving line CSN1 and CSP0 of the exemplary arrangement of FIG. 1, and performs an operation corresponding to a combination of the present embodiment and the foregoing first embodiment. In FIG. 22, reference symbol CSD0 denotes a sense amplifier driving circuit which drives the sense amplifier driving lines CSN1 and CSP0 according to control signals FS0, FAMP0, and FPC0. Further, symbol CSC0 denotes a control circuit CSC0 for the sense amplifier driving circuit, which is made up of delay circuits D1 and D2, inverters and NAND circuits to generate the control signals FS0, FAMP0 and FPC0 from control signals FSA and FR2*b*.

Figure 23:
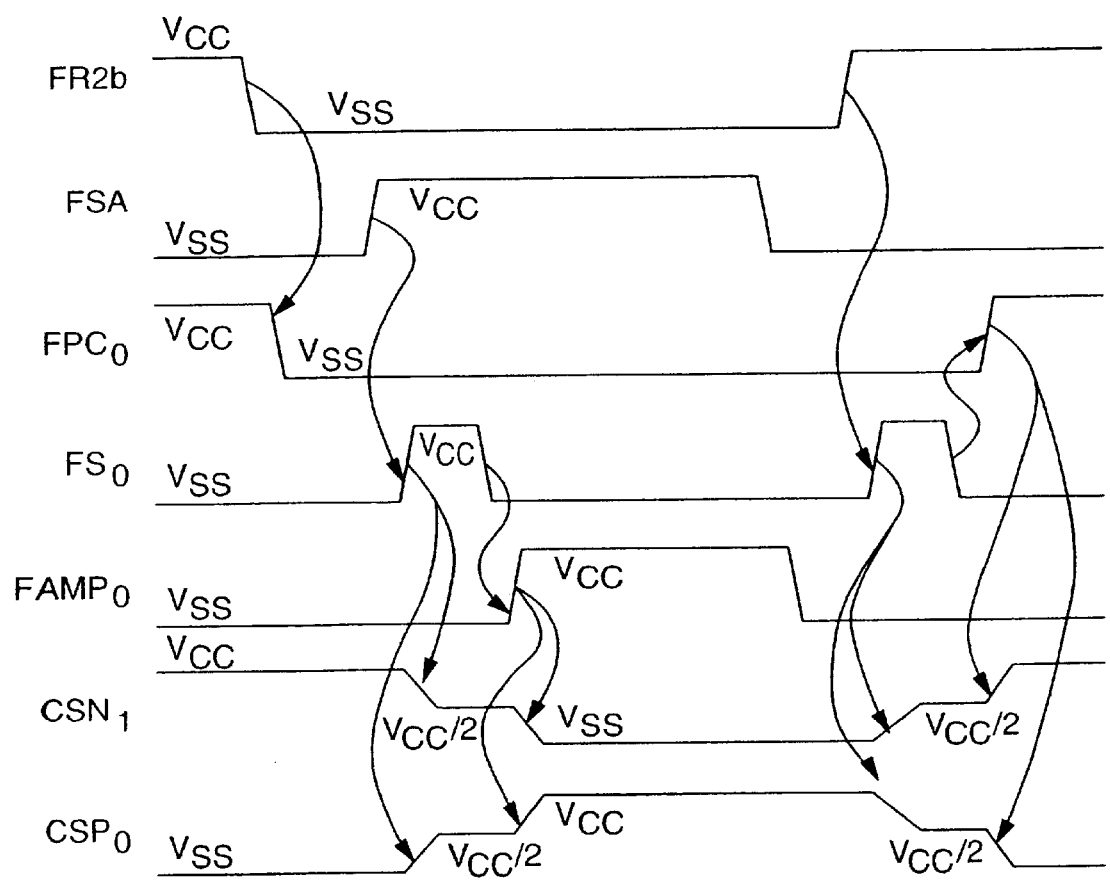
FIG. 23 is an operational timing chart of the exemplary arrangement of FIG. 22.

The operation of this exemplary arrangement will be explained with use of such a timing chart as shown in FIG. 23. First, when the control signal FR2*b* indicative of a precharge period is set at VSS, the control signal FPC0 is set at VSS so that the sense amplifier driving lines CSN1 and CSP0 are floating. Next, when the control signal FSA indicative of the operational duration of the sense amplifier is set at VCC, the control signal FS0 is set at VCC, the coupling is established between the sense amplifier driving lines CSN1 and CSP0 to perform the early sense operation. After passage of a time determined by the delay circuit D1, the control signal FS0 is returned to VSS and the control signal FAMP0 is correspondingly returned to VCC to perform the sense operation. And when the control signal FSA is returned to VSS, the control signal FAMP0 is returned to VSS. When the control signal FR2*b* is set at VCC, the control signal FS0 is set again at VCC so that the coupling is established between the sense amplifier driving lines CSN1 and CSP0 to perform the early precharge operation. After passage of a time determined by the delay circuit D2, the control signal FS0 is returned to VSS and the control signal FPC0 is correspondingly set at VCC to perform the precharge operation, returning it to the standby state.

As mentioned above, the control signal FS0 is set at VSS in the control circuit CSC to thereby set the control signal FAMP0 or FPC0 at VCC, thus enabling prevention of overlap of-the control signal FS0 and FAMP0 or FPC0 and also reduction of a delay caused by a timing margin.

When the early sense operation based of such charge share is combined with the first embodiment, the effect of reducing the array noise can be great. In the early sense operation, the operation of the data-line pair precharged to VSS as well as the operation of the data-line pair precharged to VCC take place completely simultaneously and become symmetrical with respect to the intermediate voltage VCC/2 as its center. For this reason, there is no difference in the drive timing and speed between the sense amplifiers, thus compensating the array noise.

Figure 24:
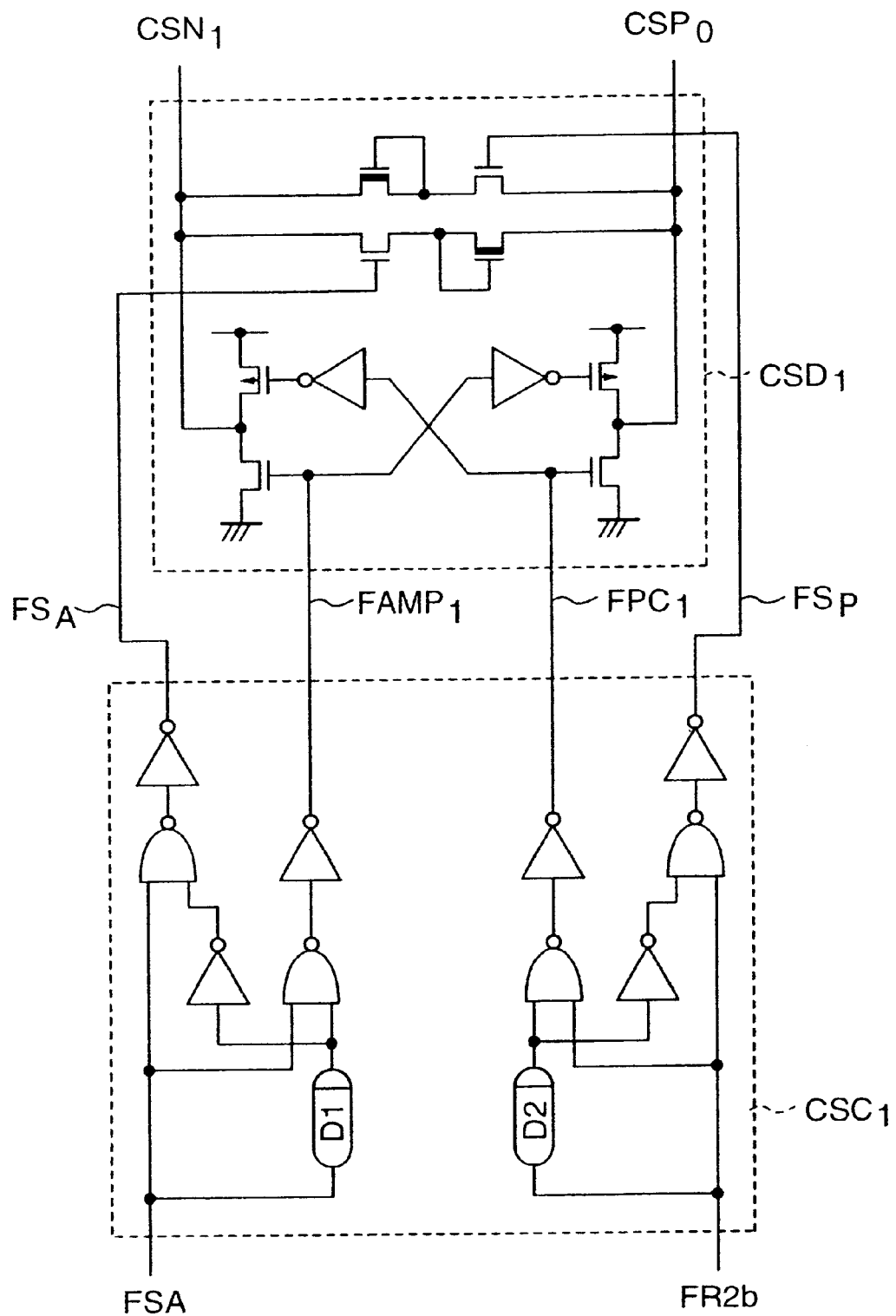
FIG. 24 shows another exemplary arrangement of the sense amplifier driving circuit and control circuit.

FIG. 24 shows another exemplary arrangement of the sense amplifier driving circuit and control circuit. This arrangement is featured in that a switch for coupling the sense amplifier driving lines has a diode characteristic. As in the exemplary arrangement of FIG. 22, this arrangement is used as connected to the sense amplifier driving lines CSN1 and SCP0 in the exemplary arrangement of FIG. 1. In FIG. 24, symbol CSD1 denotes a sense amplifier driving circuit, which drives the sense amplifier driving lines CSN1 and CSP0 according to the control signals FSA, FAMP1, FPC1 and FSP. Transistors connected to diodes in the sense amplifier driving circuit CSDL are NMOS transistors having a threshold voltage as low as nearly 0. Symbol CSC1 denotes a control circuit for the sense amplifier driving circuit, which is made up of delay circuits D1 and D2, inverters, and NAND circuits to generate control signals FSA, FAMP1, FPC1 and FSP from control signals FSA and FR2b.

Figure 25:
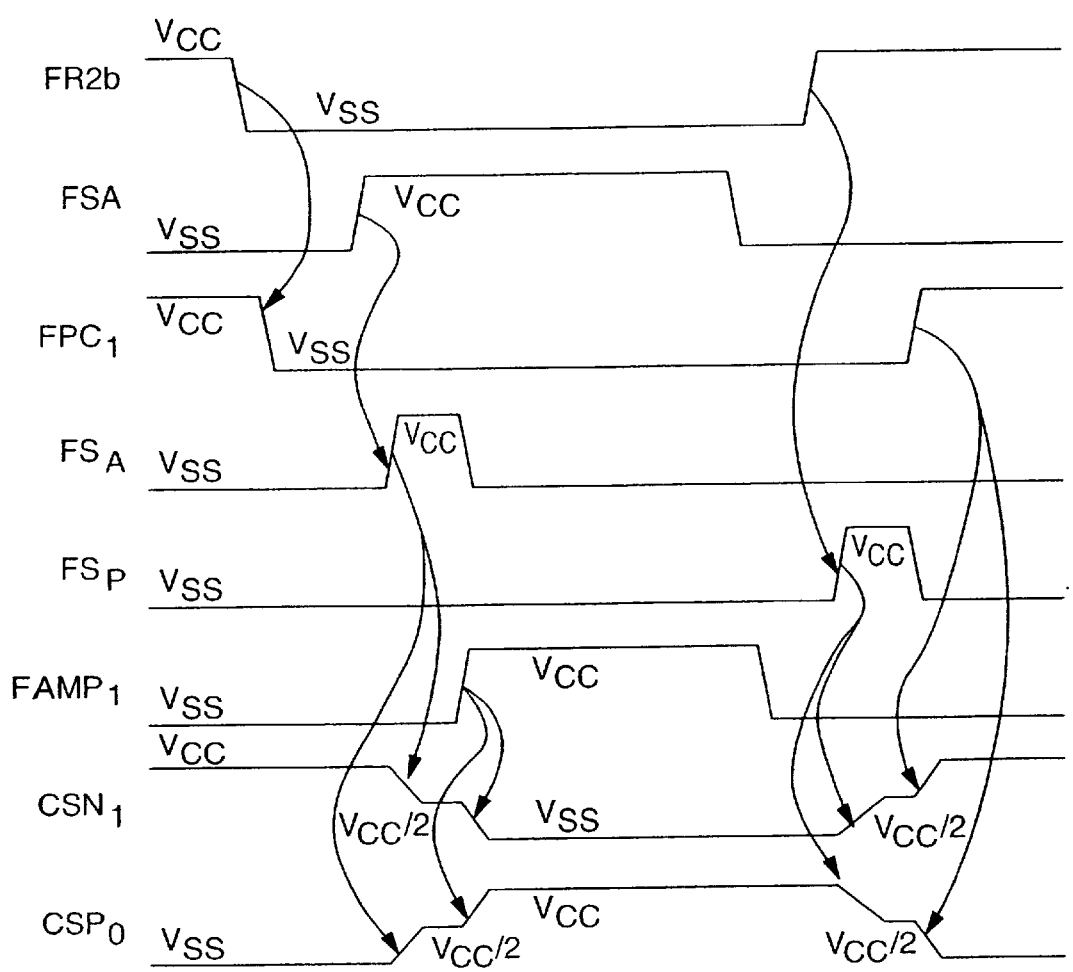
FIG. 25 is an operational timing chart of the exemplary arrangement of FIG. 24.

The operation of this exemplary arrangement will be explained by referring to such a timing chart as shown in FIG. 25. First, when the control signal FR2b indicative of a precharge duration is set at VSS, the control signal FPC1 is set at VSS. Next, when the control signal FSA indicative of an operational duration of the sense amplifier is set at VCC, the control signal FSAMP is set at VCC so that a current flows from the sense amplifier driving line CSN1 to the sense amplifier driving line CSP0 to perform the early sense operation. After passage of a time determined by the delay circuit D1, the control signal FSAMP is returned to VSS and the control signal FAMP1 is set at VCC to thereby perform the sense operation. And when the control signal FSA is returned to VSS, the control signal FAMP1 is returned to VSS. When the control signal FR2b is set at VCC, the control signal FSP is set at VCC, so that a current flows from the sense amplifier driving line CSP0 to the sense amplifier driving line CSN1 to perform the early precharge operation. After passage of a time determined by the delay circuit D2, the control signal FSP is returned to VSS and the control signal FPC1 is set at VCC to perform the precharge operation, returning it to the standby state.

Since a diode-connection transistor is inserted in series with a transistor operating as a switch between the sense amplifier driving lines CSN1 and SCP0, no current flows from the sense amplifier driving line CSP0 to the sense amplifier driving line CSN1 when the control signal FSP is set at VSS; while no current flows from the sense amplifier driving line CSN1 to the sense amplifier driving line CSP0 when the control signal FSP is set at VCC. For this reason, when the VCC duration of the control signals FSAMP and FAMP1 is overlapped with the VCC duration of the control signals FSP and FPC1, its charge consumption will not increase. For this reason, any timing margin becomes unnecessary for the control signals FSAMP and FAMP1, and FSP and FPC1, and thus reduction of the operational speed caused by the early sense and early precharge operations can be minimized. Further, the control circuit of the sense amplifier driving circuit can be simplified in configuration.

[Third Embodiment]

Figure 26:
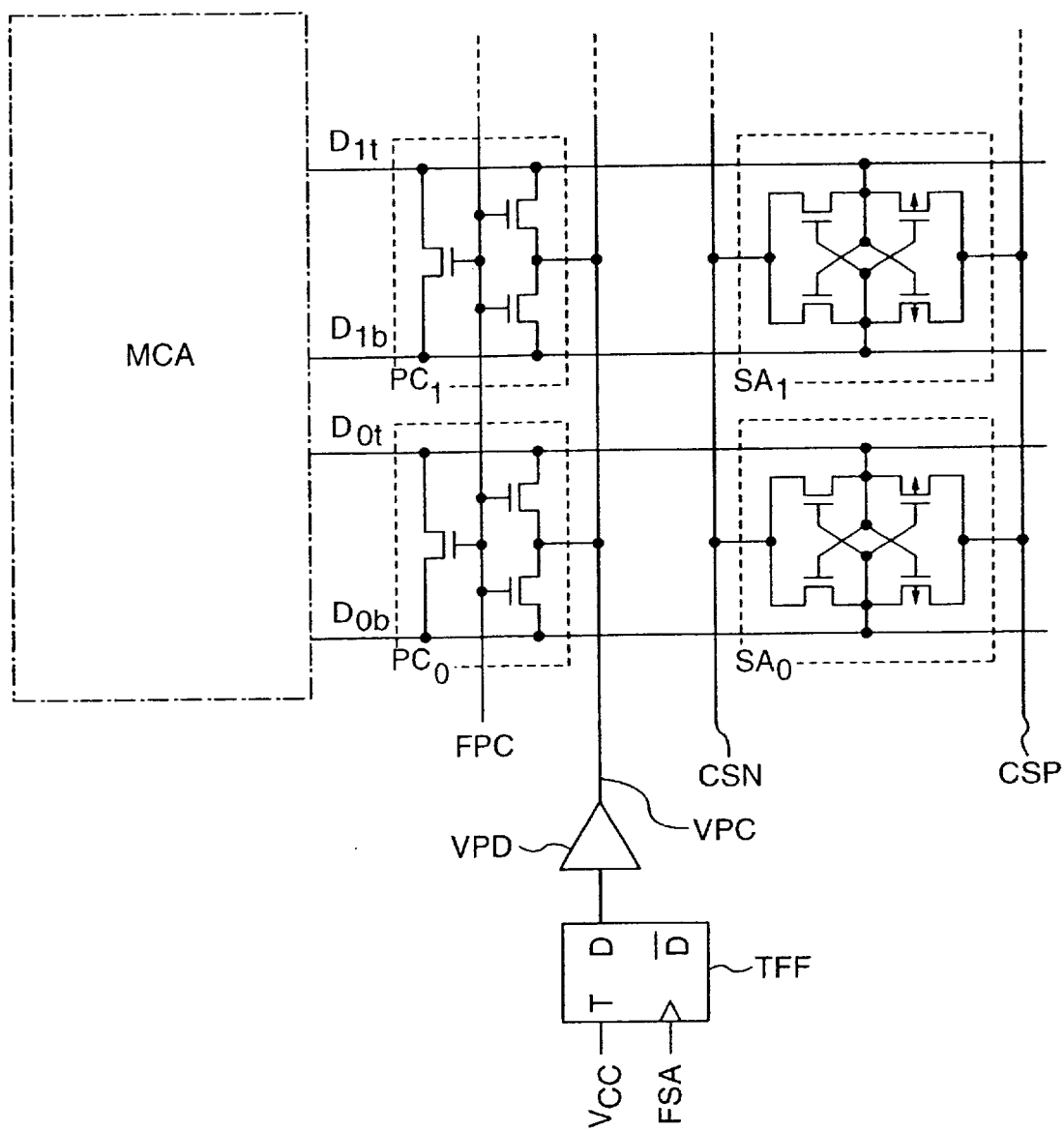
FIG. 26 is an exemplary basic arrangement of a third embodiment.

Explanation will now be made as to an embodiment for realizing the aforementioned third means. A major part of an exemplary arrangement of the embodiment is shown in FIG. 26. This arrangement is featured in that the precharge voltages of the data lines are switched to VCC and VSS for each operational cycle. Precharge circuits PC0, PC1, . . . and sense amplifiers SA0, SA1, . . . are connected to data-line pairs D0b and D0t, D1b and D1t, . . . The precharge circuits and sense amplifiers have such a circuit configuration as shown in FIG. 1. An output of a T flip-flop is supplied as the precharge voltage VPC to the precharge circuits PC0 and PC1 through a driving circuit VPD. The driving circuit VPD is made up of, for example, a plurality of CMOS inverters connected in series. Symbol MCA denotes a memory cell array, which is arranged, e.g., as shown by MCA1 in FIG. 2. For simplicity, I/O lines and I/O gates for data transfer from or to external devices are omitted in the drawing.

Figure 27:
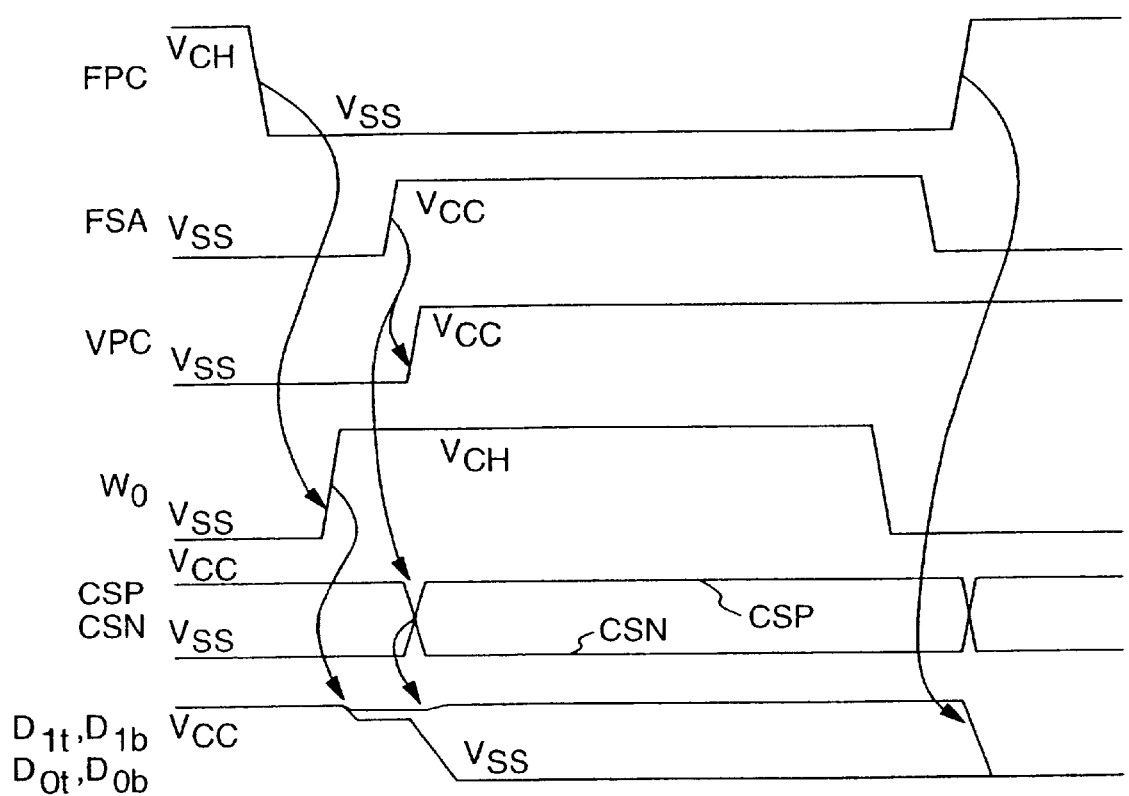
FIG. 27 is a basic operational timing chart of the third embodiment.

The operation of this exemplary arrangement will be explained by referring to such a timing chart as shown in FIG. 27. The drawing shows when the precharge voltage VPC is set at VSS. In the standby state, since the control signal FPC is set at VCH, NMOS transistors in the precharge circuits PC0, PC1, . . . are put in their ON state so that the data-line pairs D0b and D0t, D1b and D1t, . . . are precharged to VSS. For operation, the control signal FPC causes the precharge circuits to be turned OFF. When the word line (WO in FIG. 27) is set at the voltage VCH at selection, the memory cell is selected and its remnant polarization is read out to the data line as charge. Next, the control signal FSA indicative of an operational duration of the sense amplifier causes the output of the T flip-flop to be inverted so that the precharge voltage VPC is set at VCC. Further, the sense amplifier driving line CSP is set at VCC and the sense amplifier driving line CSN is set at VSS so that the sense amplifiers SA0, SA1, . . . differentially amplify voltages on data lines in each pair. When signal transfer to or from external devices is carried out under such a condition that the sense amplifier amplifies the signal data, the read or write operation is carried out. After the word line W0 is lowered, the control signal FPC causes the precharge circuits to be turned ON, thus precharging the data-line pairs D0b and D0t, D1b and D1t, . . . to VCC. Further, the sense amplifier driving line CSP is returned to VSS and the sense amplifier driving line CSN is returned to VCC to stop the operation of the sense amplifier.

Though not illustrated in the drawing, in a next operational cycle, the precharge voltage VPC is switched from VCC to VSS so that the data line pair so far precharged is precharged to VSS.

Through the aforementioned operations, the above third problem can be solved in such a manner as to be explained below. The precharge of the data lines driving the word line is switched to VCC and VSS in each cycle. Even when attention is directed to a certain word line, the VSS precharge and VCC precharge are repeated by the same number of VSS and VCC precharge times from the viewpoint of its probability. When a read operation is carried out in the VSS precharge, the polarization of the ferroelectric capacitor having "1" written therein is inverted, and application of VCC thereto for rewrite operation causes the polarization to be again inverted. Meanwhile, the capacitor having "0" so far written therein is not inverted. When a read operation is carried out in the VCC precharge, the polarization of the ferroelectric capacitor having "0" so far written therein is inverted, and application of VSS for rewriting causes the polarization to be again inverted. Meanwhile, the capacitor having "1" so far written therein is not inverted. Since the number of reversal writes of the memory cell is usually smaller than the number of times of selection of the word line, it is considered the same data is repetitively sensed and rewritten. That is, it is considered that the reversal and non-reversal operations are repeated. As a result, the fatigue of the ferroelectric capacitor can. be suppressed. Further, imprint can be prevented. Accordingly, the deterioration of the ferroelectric capacitor can be suppressed and the endurance of the ferroelectric memory device can be improved.

In particular, when the insulating film of the ferroelectric capacitor is made of PZT, this is effective. As explained in IEEE International Sold-State Circuit Conference, Digest of Technical Papers, pp. 68–69, February, 1995, PZT is advantageous in its large remanent polarization but is disadvantageous in its large fatigue influence. Since the present scheme can suppress the deterioration, it can make the most of the PZT's advantage of the large remanent polarization.

Though omitted in the drawing, the present scheme is especially valid when the reverse polarization is used in the dummy cell for generating a reference voltage. The dummy cell used in the reverse polarization is, as disclosed in JP-A-2-110893, made up of a ferroelectric capacitor for reverse polarization and a ferroelectric capacitor for no reverse polarization. When the present scheme is employed, the ferroelectric capacitors in the dummy cell can repeat reversal and non-reversal of the polarization, thus suppressing the deterioration.

In the operation of FIG. 27, in the standby state, the sense amplifier driving line CSN is set at VCC and the sense amplifier driving line CSP is set at VSS so that the same control can be performed over the sense amplifier driving lines regardless of the precharge voltages. Thereby the arrangement of the control circuit of the sense amplifier driving lines can be simplified.

Though the T flip-flop has been used to switch the precharge voltages in each cycle in this embodiment, a counter may be used to switch them on each plural-cycle basis. Further, a timer may be used to switch them at intervals of a constant time. When the switching frequency is made small, the effect of suppressing the deterioration of the ferroelectric capacitor becomes small, but the power consumption necessary for charge/discharge of the precharge voltages of the supply lines can be made small.

Figure 28:
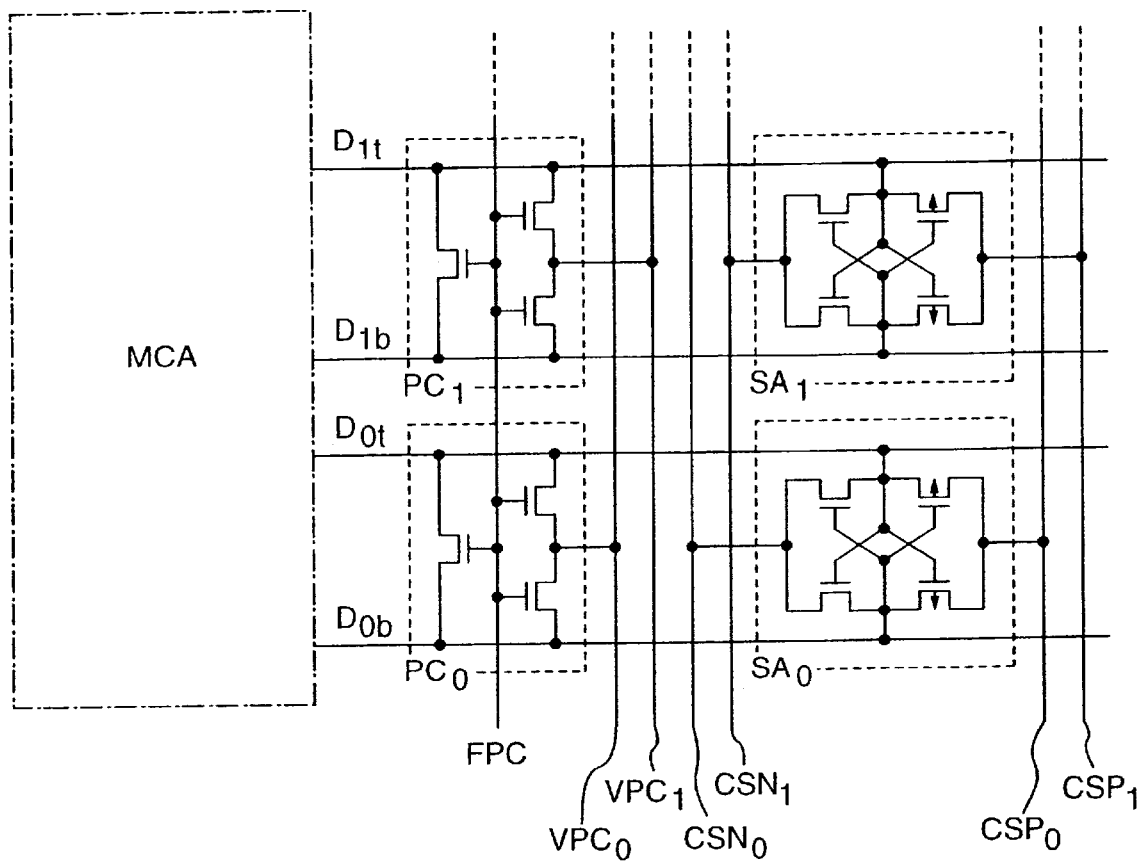
FIG. 28 shows an exemplary arrangement of a combination of the third and first embodiments.

FIG. 28 is an exemplary arrangement of a combination with the first embodiment, which is featured in that precharge voltages of data line pairs in the memory cell array are grouped into two of VSS and VCC and the voltage switching is carried out in each cycle. Precharge circuits PC0, PC1, . . . and sense amplifiers SA0, SA1, . . . are connected to data-line pairs D0$b$ and D0$t$, D1$b$ and D1$t$, . . . precharge voltage VPC0 is connected to the precharge circuits PC0 and PC2, while the precharge voltage VPC1 is connected to the precharge circuits PC1 and PC3. For simplicity, I/O lines and I/O gates for data transfer from or to external devices are omitted in the drawing.

Figure 29:
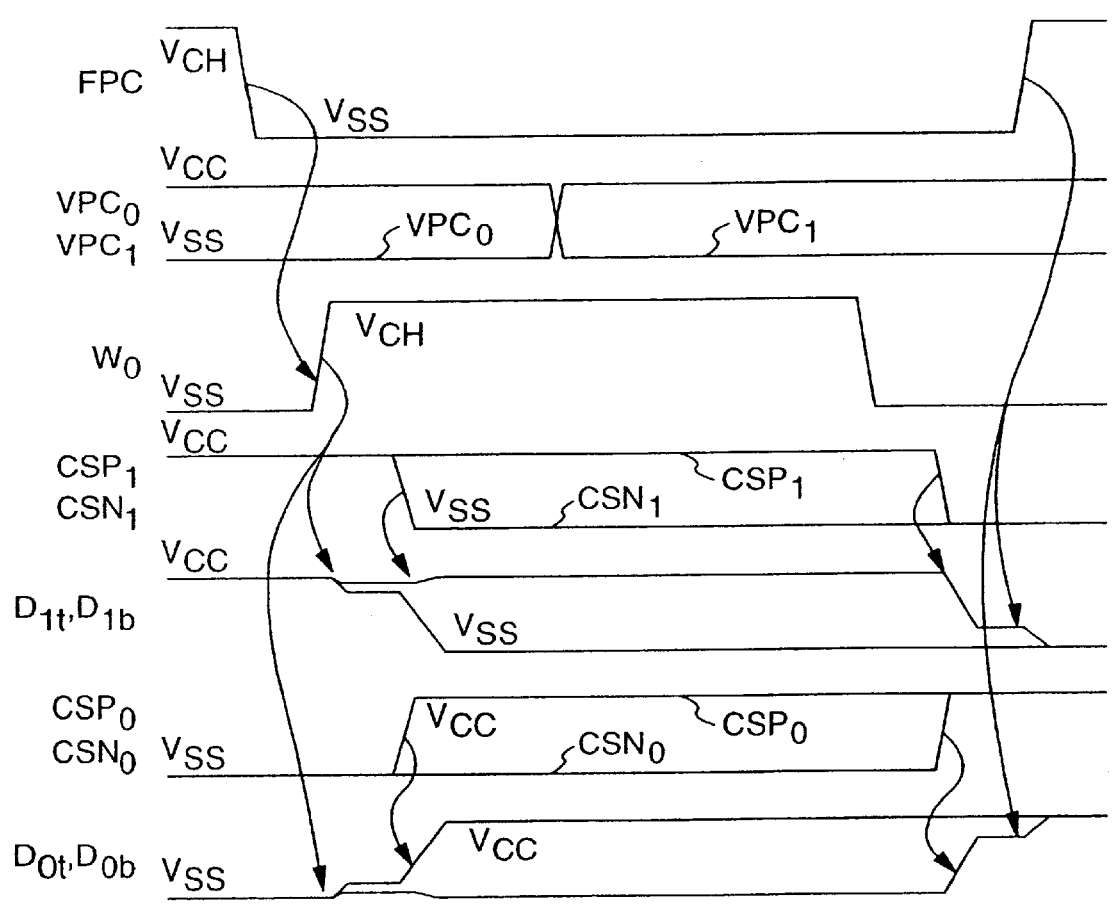
FIG. 29 is an operational timing chart of the exemplary arrangement of FIG. 28.

The operation of this exemplary arrangement will be explained by referring to such a timing chart as shown in FIG. 29. The timing chart shows when the precharge voltage VPC0 is set as VSS and the precharge voltage VPC1 is set at VCC. In the standby state, the precharge circuits PC0, PC1, . . . cause the data-line pair D0$b$ and D0$t$ to be precharged to VSS and the data-line pair D1$b$ and D1$t$ to be precharged to VCC. The control signal FPC causes the precharge circuits to be turned OFF and the word line (W0 in FIG. 29) to be set at the selected-word-line voltage VCH, so that the memory cell is selected and its remanent polarization is read out to the data line as charge. Further, the sense amplifier driving line CSP0 is set at VCC and the sense amplifier driving line CSN1 is set at VSS to differentially amplify the voltages of the data lines in each pair. Read or write operation is carried out when signal transfer from or to external devices is carried out under such a condition that the sense amplifier amplifies the data. At this time, the precharge voltage VPC0 is set at VCC while the precharge voltage VPC1 is set at VSS. After the word line W0 is lowered, the control signal FPC causes the precharge circuits to be turned ON and the data line pair D0$b$ and D0$t$ to be precharged to VCC and the data line pair D1$b$ and D1$t$ to be precharged to VSS. Further, the sense amplifier driving line CSP1 is returned to VSS and the sense amplifier driving line CSN0 is returned to VCC to stop the operation of the sense amplifier.

Though not illustrated, in the next operational cycle, the precharge voltage VPC0 is switched from VCC to VSS and the precharge voltage VPC1 is switched from VSS to VCC, so that the data-line pair so far precharged to VCC is precharged to VSS and the data-line pair so far precharged to VSS is precharged to VCC.

Due to the above operations, compatibility can be realized between the effects of the first and third embodiments. In other words, the array noise can be reduced to improve the S/N ratio, and the deterioration of the ferroelectric capacitor can be suppressed to improve its endurance.

Figure 30:
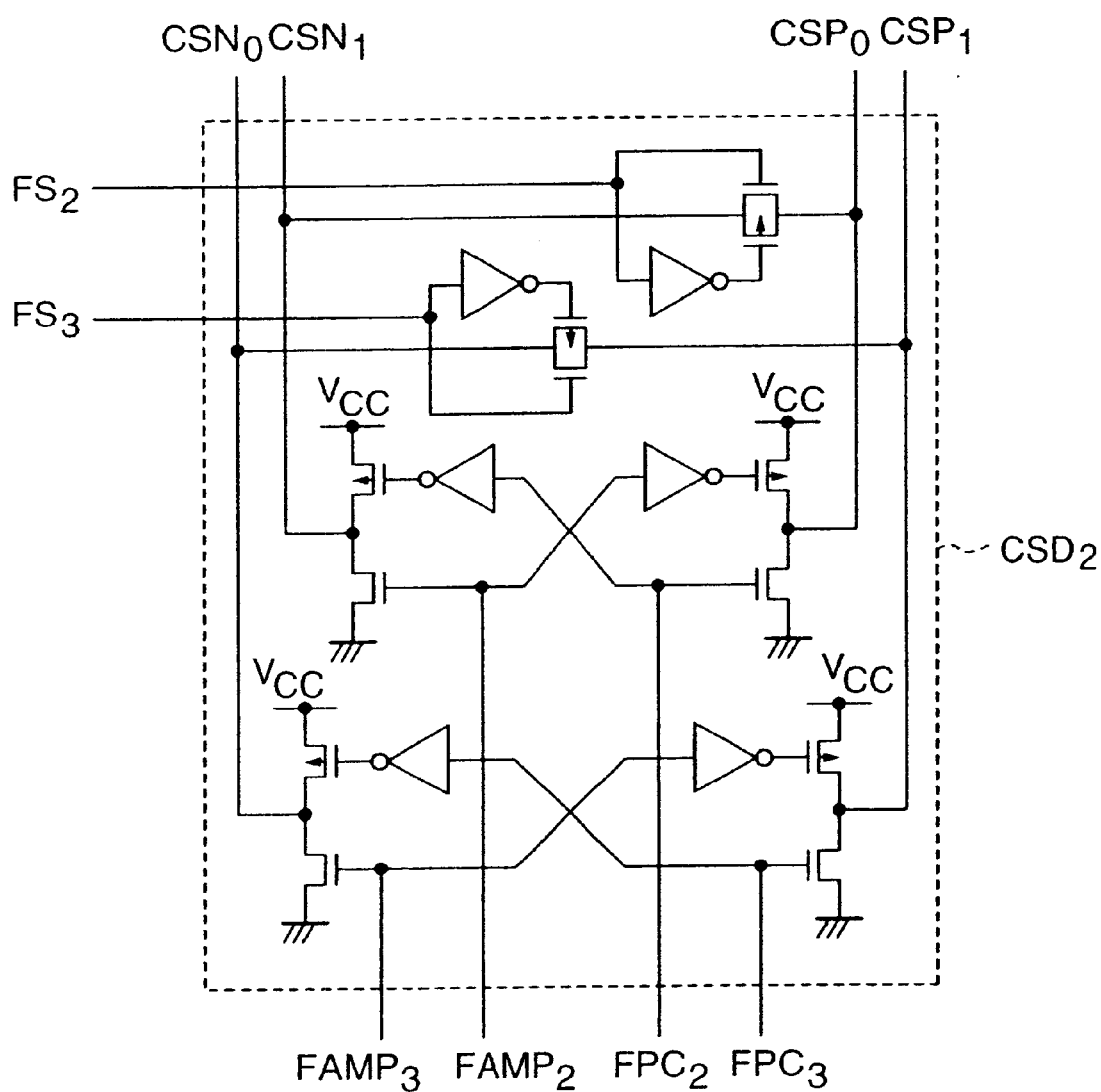
FIG. 30 is an exemplary arrangement of a sense amplifier driving circuit in the third embodiment.

FIG. 30 shows an exemplary arrangement of a sense amplifier driving circuit. This arrangement is used as connected to the sense amplifier driving lines CSN0, CSN1, CSP0 and CSP1 of the exemplary arrangement of FIG. 28 to perform operation corresponding to the combined operation of the present embodiment, above first and second embodiments. In FIG. 30, symbol CSD2 denotes a sense amplifier driving circuit, which drives the sense amplifier driving lines CSN0, CSN1, CSP0 and CSP1 according to control signals FS2, FS3, FAMP2, FAMP3, FPC2 and FPC3.

Figure 31:
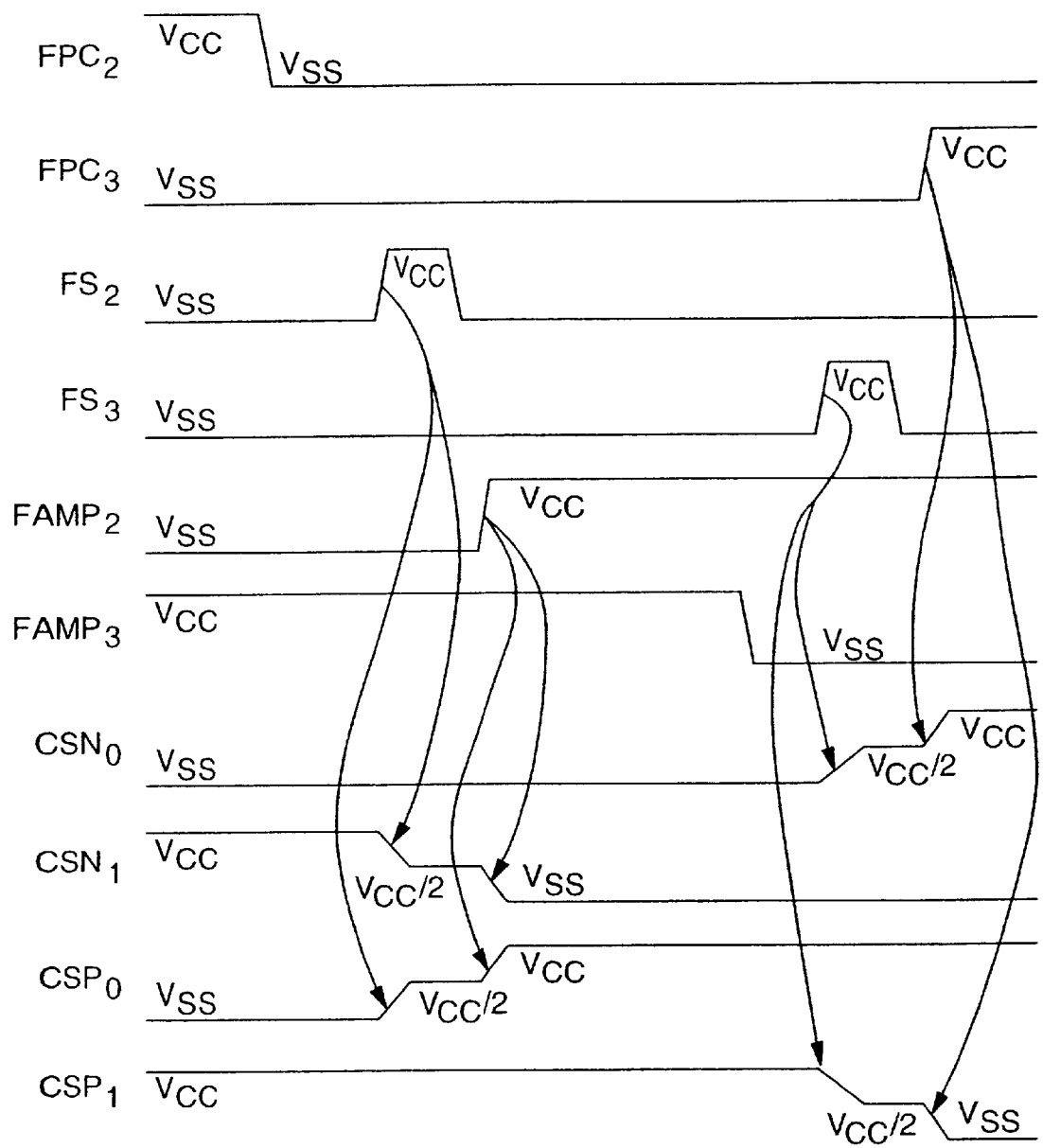
FIG. 31 is an operational timing chart of the exemplary arrangement of FIG. 28.

The operation of this exemplary arrangement will be explained with use of such a timing chart as shown in FIG. 31. As in FIG. 29, this timing chart shows when the precharge voltage VPC0 is set as VSS and the precharge voltage VPC1 is set at VCC. First, the control signal FPC2 is set at VSS so that the sense amplifier driving lines CSN1 and CSP0 are floating. Next, the control signal FS2 is set at VCC so that the coupling is established between the sense amplifier driving lines CSN1 and CSP0 to perform the early sense operation. The control signal FS2 is returned to VSS and the control signal FAMP2 is correspondingly returned to VCC so that the sense amplifier driving line CSN1 is set at VSS and the sense amplifier driving line CSP0 is set at VCC to perform the sense operation. And the control signal FAMP3 is returned to VSS and the control signal FS3 is set at VCC so that the coupling is realized between the sense amplifier driving lines CSN0 and CSP1 to perform the early precharge operation. The control signal FS3 is returned to VSS and the control signal FPC3 is correspondingly returned to VCC to perform the precharge operation.

In this way, the early sense and early precharge operations based on charge share enable simultaneous acquirement of the effect of the second embodiment together with the effects of the first and third embodiment. That is, the array noise can be reduced to improve the S/N ratio, the deterioration of the ferroelectric capacitor can be suppressed to improve its endurance, and the charge consumption necessary for charge/discharge of the data lines can be reduced to reduce power consumption.

Figure 32:
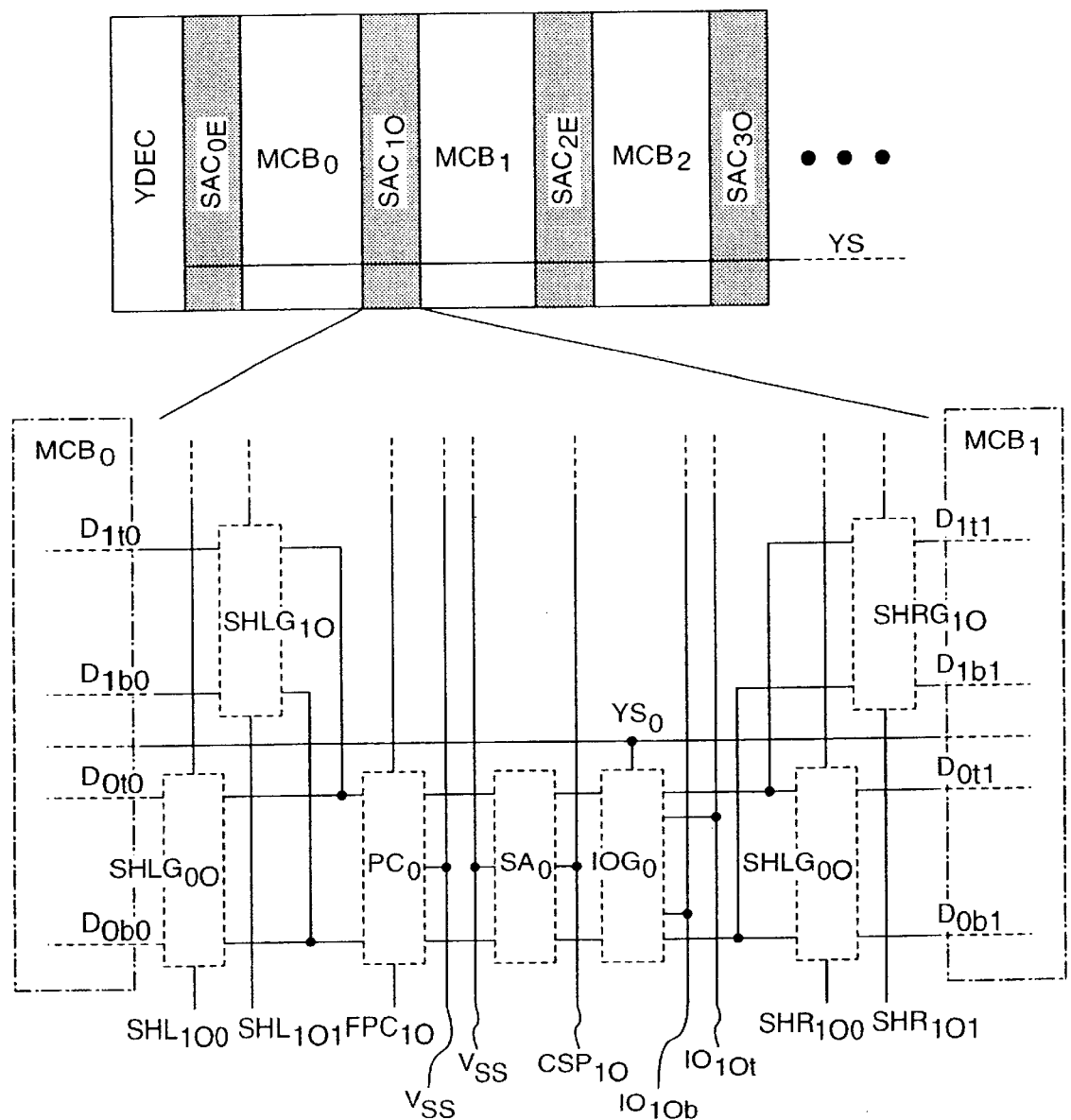
FIG. 32 shows a part of an exemplary arrangement when sense amplifiers are positioned at both ends of a memory cell array in the third embodiment.
Figure 33:
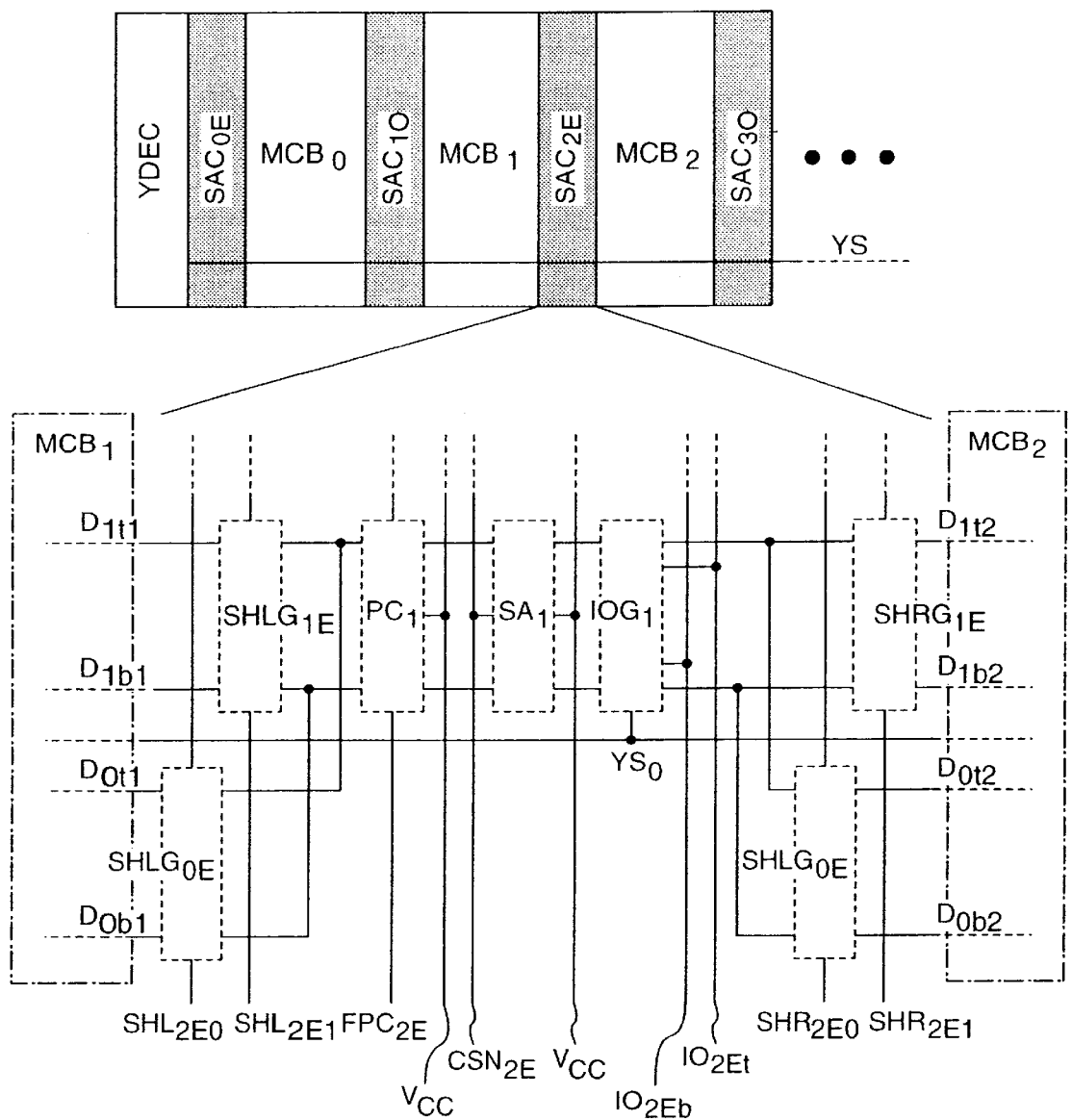
FIG. 33 shows another part of the exemplary arrangement when the sense amplifiers are positioned at both ends of the memory cell array in the third embodiment.

FIGS. 32 and 33 show an exemplary arrangement when a sense amplifier is provided at both sides of a memory cell array. The arrangement is featured in that precharge voltages are switched by shared gates. When compared with the exemplary arrangement of FIGS. 16 and 17 wherein a sense amplifier is provided at both sides of the memory cell array in the first embodiment, this arrangement is different in that a sense amplifier is shared by a twice as many number of data-line pairs due to shared gates. Symbols MCB0, MCB1, MCB2, . . . denote memory cell arrays, which are each arranged, for example, as shown by MCA1 in FIG. 2. Sense amplifier parts SAC0E, SAC1O, SAC2E, SAC3), . . . are provided between two memory cell arrays as shared thereby; and the sense amplifier parts provided at both sides of each memory cell array perform the sense operation. Further, a column decoder YDEC is commonly provided to pluralities of memory cell arrays and sense amplifier parts, and column select lines YS (such as YS0) are extended on the memory cell arrays. The interconnection of the sense amplifier parts is repeated on each 2-amplifier-part basis. The sense amplifier part SAC1O is arranged as shown in FIG. 32, the sense amplifier part SAC2E is arranged as shown in FIG. 33, the sense amplifier and the precharge circuit are provided for every two data-line pairs as connected by the shared gates. Symbols SHLG0O, SHLG1O, SHRG0O, SHRG1O, SHLG0E, SHLG1E, SHRG0E and SHRG1E denote shared gates, symbols IOG0 and IOG1 denote I/O gates, which have such circuit configurations as shown in FIG. 9. Symbols PC0 and PC1 denote precharge circuits, symbols SA0 and SA1 denote sense amplifiers, which have such circuit configurations as shown in FIG. 1. The ground voltage VSS is supplied to the precharge circuit PC0, while the source voltage VCC is supplied to the precharge circuit PC1.

Figure 34:
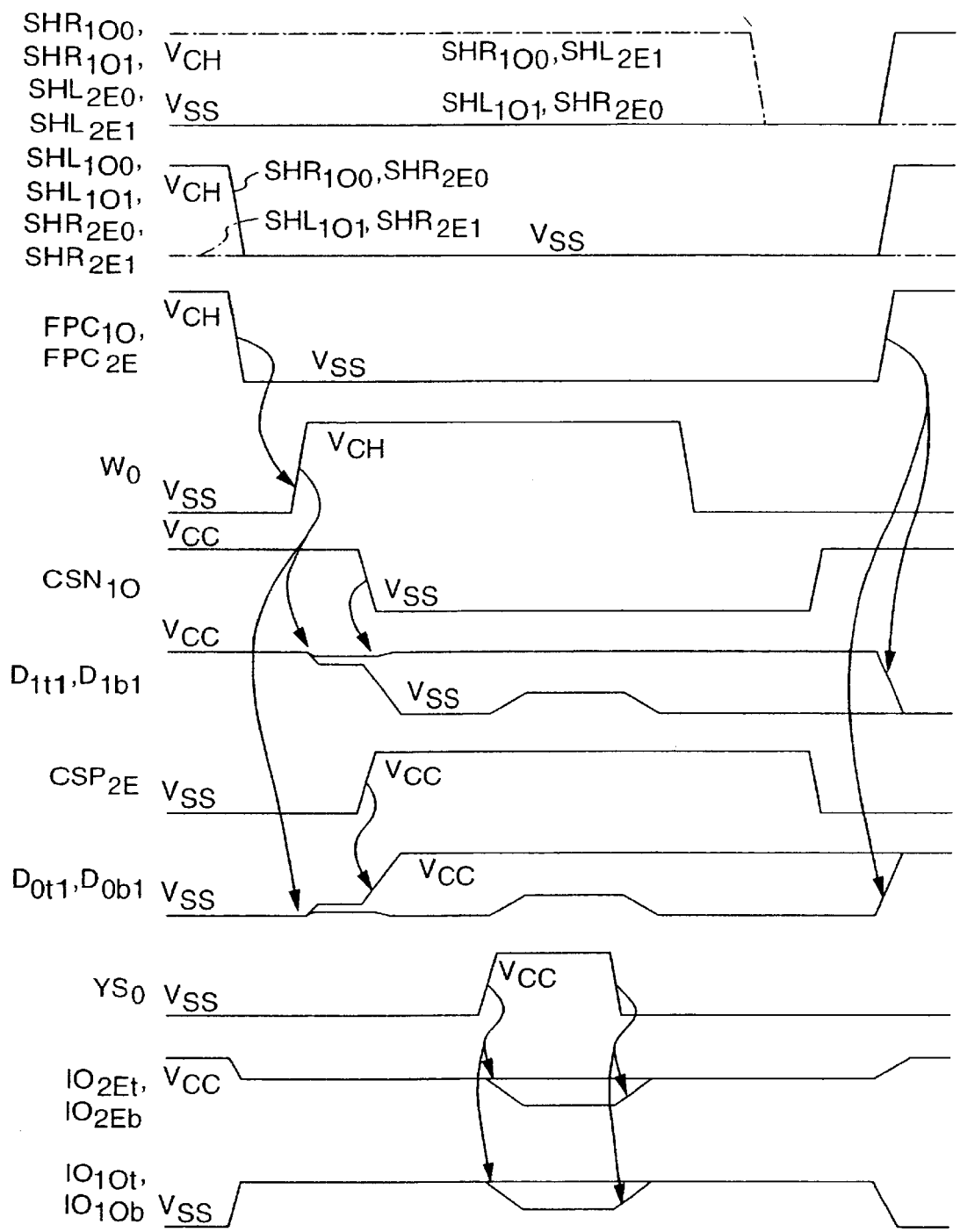
FIG. 34 is a read operation timing chart of the exemplary arrangements of FIGS. 32 and 33.
Figure 35:
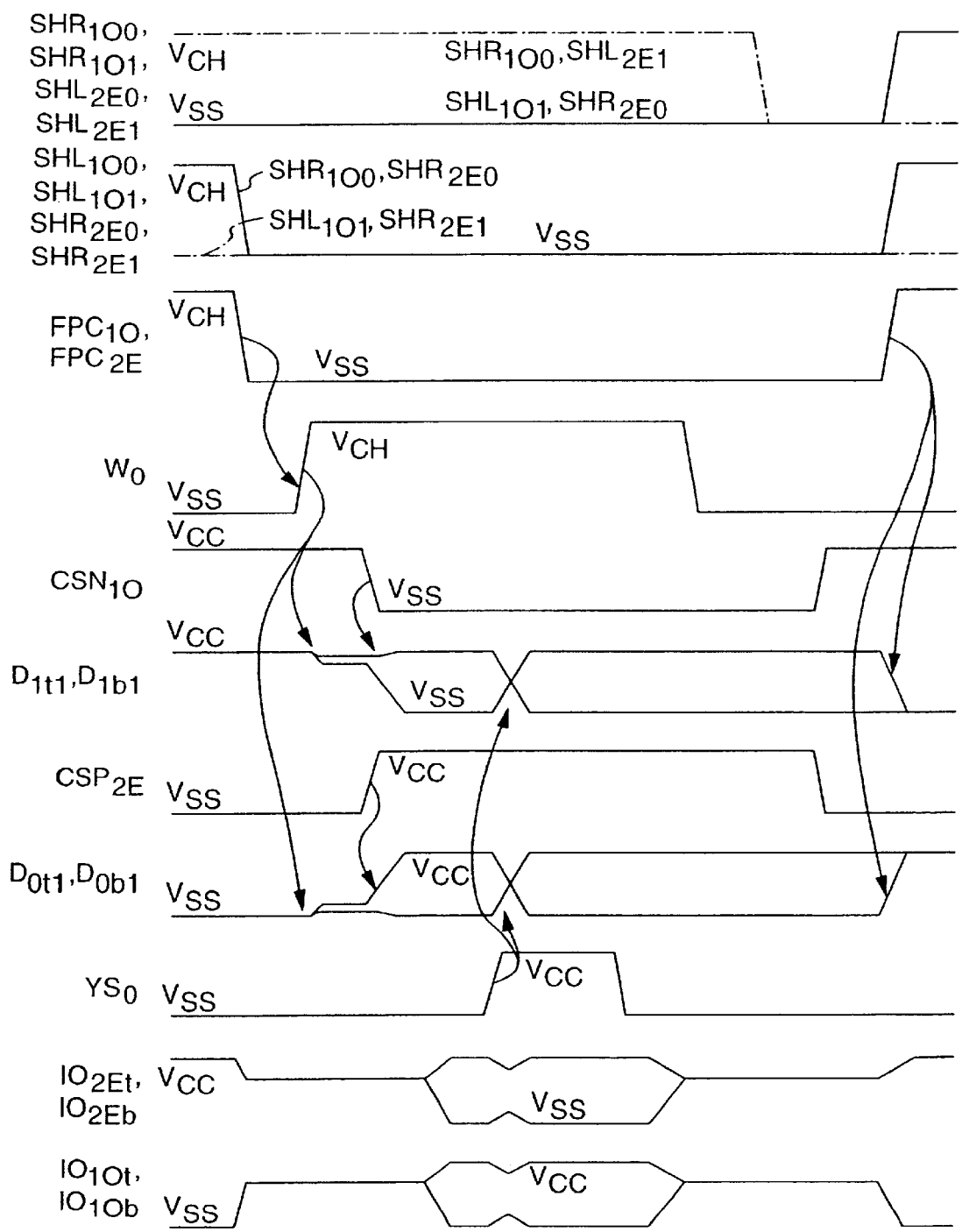
FIG. 35 is a write operation timing chart of the exemplary arrangements of FIGS. 32 and 33.
Figure 36:
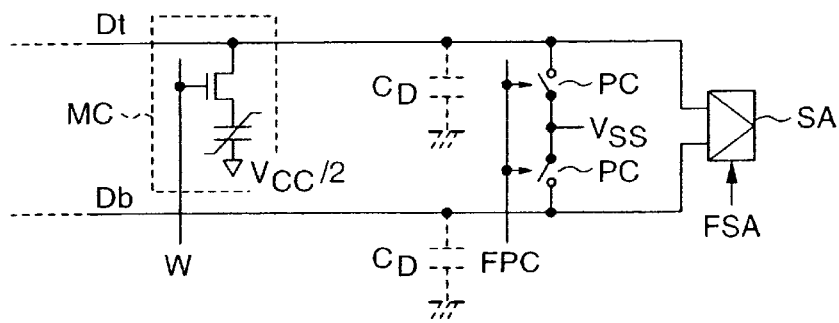
FIG. 36 shows an exemplary basic arrangement of a prior art.
Figure 37:
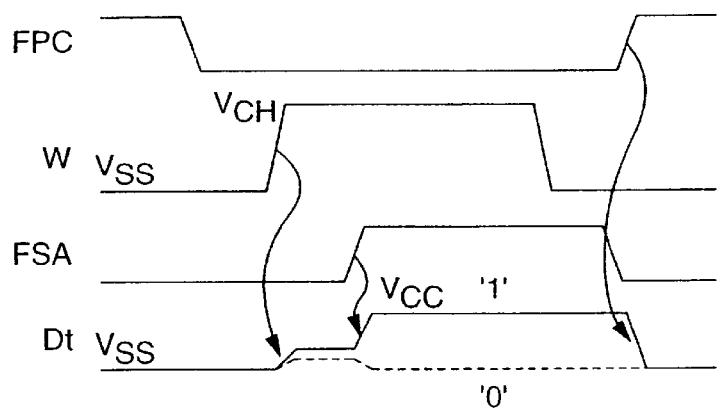
FIG. 37 shows a basic operational timing chart of the prior art.
Figure 38:
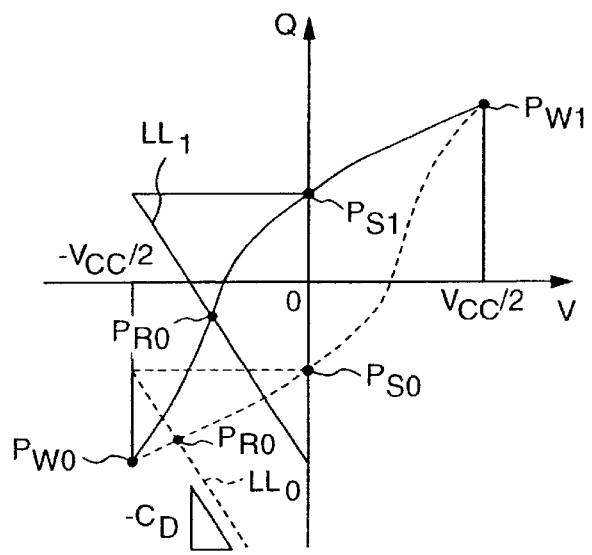
FIG. 38 shows a hysteresis characteristic of a ferroelectric capacitor.

The read and write operations are carried out as shown in FIGS. 34 and 35 respectively. The drawings show when the word line W0 is selected in the memory cell array MCB1 to read or write signals from the data-line pair D0*tl* and D0*bl* so far precharged to VSS and from the data-line pair D1*tl* and D1*bl* so far precharged to VCC. In the standby state, the data-line pair D0*tl* and D0*bl* are coupled with the precharge circuit PC0 and sense amplifier SA0 in the sense amplifier part SAC1O, while the data-line pair D1*tl* and D1*bl* are coupled with the precharge circuit PC1 and sense amplifier SA1 in the sense amplifier part SAC2E. First, the control signals SHL1O0 and SHR2E0 are set at VSS so that the shared gates SHLG0E and SHRG0E cause the memory cell array MCB0 to be separated from the sense amplifier part SAC1O and the memory cell array MCB2 to be separated from the sense amplifier part SAC2E. Next, as in the operation shown in FIGS. 18 and 19, the sense operation, read or write operation, and rewrite operation are carried out. After the word line W0 is returned to VSS, the control signals SHR1O0 and SHL2E1 are set at VSS so that the shared gates SHRG0O and SHLG1E cause the data-line pairs D0*tl* and D0*bl*, and D1*tl* and D1*bl* to be separated from the sense amplifier parts. And the sense amplifier driving line CSN1O is set at VCC and the sense amplifier driving line CSP2E is set at VSS to stop the operation of the sense amplifiers SA0 and SA1. Then the control signals SHR1O1 and SHL2E0 are set at VSS so that the shared gate SHRG1O and SHLG0E cause coupling of the data-line pairs D0*tl* and D0*bl*, and D1*tl* and D1*bl* with the sense amplifier part provided on the opposite side, the control signals FPC1O and FPC2E are set at VCC to perform the precharge operation. Thereby the data-line pair D0*tl* and D0*bl* is precharged to VCC and the data-line pair D1*tl* and D1*bl* is precharged to VSS.

Though not illustrated, in the next operational cycle, through the switching of the control signals of the shared gates, the data-line pair so far precharged to VCC is precharged to VSS, while the data-line pair so far precharged to VSS is precharged to VCC.

With this exemplary arrangement, compatibility can be established between the effects of the exemplary arrangement of FIGS. 17 and 18 and the high-endurance effect of the third embodiment. In addition, even when the precharge of the data-line pairs is switched, the precharge voltage of the sense amplifier part is made constant, whereby the precharge circuits and sense amplifiers can be easily controlled. Further, it is unnecessary to perform switching of supply line voltages for precharge voltages.

In the foregoing, the first to third embodiments have been explained in connection with the various exemplary arrangements and operational timing charts. The present invention is not limited only to the above explained arrangements but also may be modified in various ways in a range not departing from the gist of the invention. For example, though the explanation has been made in connection with the case where the source voltage VCC and ground voltage VSS are used as write voltages, internal supply voltages generated in a voltage down converter, etc. within a chip may be instead used. In this case, device reliability can be secured with a high reliability independently of an external supply voltage. The voltage to be used for the precharge is not required to coincide with the write voltage, and any precharge voltage may be employed so long as it causes a change of the polarization status of the ferroelectric capacitor at the time of selection of a memory cell. For example, the precharge voltage can be set so that a difference of the precharge voltage from the plate voltage is larger than that of the write voltage therefrom. In this case, even when the ferroelectric capacitor has a large capacitance, the application voltage to the sense amplifier driving line can be set to have a sufficient magnitude, since, during driving of the word line, compensating the charge in the capacitance of the data line shared with the capacitance of the ferroelectric capacitor. Further, the voltage to be applied to the sense amplifier driving line is not required to coincide with the write voltage and any voltage may be employed so long as it causes the data line voltage to be set at a desired write voltage. For example, the voltage applied to the sense amplifier driving line can be set to be temporarily larger than such a level that a difference from the precharge voltage is larger than the write voltage, and, when the data line voltage comes near the write voltage, can be set at the write voltage. In this case, the voltage difference applied to the sense amplifier can be made large to speed up the amplifying operation of the sense amplifier.

Further, the precharge circuit and sense amplifier may have various circuit configurations. For example, even when a transistor equalizing the data line pair is removed from the precharge circuit, it can operate. The sense amplifier always operating in the VCC precharge mode may also comprise such an NMOS sense amplifier as used in the VCC precharge DRAM. Similarly, the sense amplifier always operating in the VSS precharge mode may comprise only PMOS transistors. Further, the memory cell may also made up of ferroelectric capacitors and PMOS transistors.

As has been explained in the foregoing, in accordance with the present invention, the problem of the ferroelectric memory that the VCC/2 precharge scheme widely used in DRAM cannot be employed, can be solved. That is, when the precharge voltages are previously grouped for each data line in the memory cell array, the array noise can be reduced to improve the S/N ratio. Further, when the charge share between the data-line pairs precharged to different voltages is employed, charge consumption necessary for charge/discharge of the data lines can be decreased to reduce power consumption. Furthermore, when the precharge voltages of the data-line pair are switched according to the operational cycle, the deterioration of the ferroelectric capacitor can be suppressed with a high endurance.

What is claimed is:

1. A ferroelectric memory device comprising:
   memory cells, each including a ferroelectric capacitor with an insulating film of ferroelectric material and including a transistor connected to one of electrodes of the ferroelectric capacitor;
   a data line connected to the memory cells; and
   a precharge circuit for precharging said data line to a first or second precharge potential, and
   wherein the potential of another electrode of said ferroelectric capacitor of each of said memory cells is set to be between said first and second precharge potentials, and said precharge circuit alternates between precharging said data line with said first precharge potential and precharging said data line with said second precharge potential.

2. A ferroelectric memory device according to claim 1, further comprising a control circuit for controlling the potentials supplied to said precharge circuit, wherein said control circuit includes a flip-flop circuit.

3. A memory device with an electric polarization storage portion, comprising:
   memory cells, each including a first means with electric polarization properties for storing data and a second means for accessing said first means, said second means having one end connected to one end of said first means corresponding thereto;
   third means for carrying data to or from said memory cells; and
   fourth means for precharging said third means to either a first voltage potential or a second voltage potential,
   wherein another, opposing end of said first means has a preset voltage potential applied thereto of a value inbetween that of said first and second potentials, and
   wherein said fourth means alternates between precharging said third means with said first potential and precharging said third means with said second potential.

4. A memory device with an electric polarization storage portion according to claim 3, further comprising fifth means for controlling the potential supplied to said fourth means.

5. A memory device with an electric polarization storage portion according to claim 4, wherein said fifth means includes a toggle switch and a circuit driver in series therewith.

6. A memory device with an electric polarization storage portion according to claim 4, wherein said fifth means includes a T flip-flop, a counter or a timer.

7. A memory device with an electric polarization storage portion according to claim 4, wherein said fourth means alternates precharging said third means with said first voltage potential and said second voltage potential during a precharge portion in successive operating cycles.

8. A memory device with an electric polarization storage portion according to claim 4, wherein said fourth means alternates precharging said third means with said first voltage potential and said second voltage potential at regular intervals, each and every interval constituting a same number of operating cycles, and each operating cycle having a portion thereof consisting of a precharge operation.

9. A memory device with an electric polarization storage portion according to claim 8, wherein said each and every interval is constituted by a same plural number of successive operating cycles.

10. A memory device with an electric polarization storage portion according to claim 8, wherein said each and every interval is constituted by one or more operating cycles, a part of each operating cycle being a precharging operation.

11. A memory device with an electric polarization storage portion according to claim 4, wherein said fourth means alternates precharging said third means with said first voltage potential and said second voltage potential at predetermined time intervals.

12. A memory device with an electric polarization storage portion according to claim 3, wherein said second voltage potential has a magnitude greater than said first voltage potential.

13. A memory device with an electric polarization storage portion according to claim 12, wherein said first voltage potential is a reference ground potential.

14. A memory device with an electric polarization storage portion according to claim 3, wherein said second voltage potential is a positive voltage and said first voltage potential is a reference voltage.

15. A memory device with an electric polarization storage portion according to claim 14, wherein said reference voltage is ground voltage.

16. A ferroelectric memory device, comprising:
    a plurality of memory cells, each including a ferroelectric capacitor and a transistor switch connected thereto;
    at least one data line pair extended in a first direction and a plurality of word lines extended in a second direction, perpendicular to said first direction,
    wherein each of said memory cells is coupled to one or the other data line of each of said at least one data line pair and to one of said word lines, on-off operation of said transistor switch of each said memory cell is controlled by a corresponding word line signal; and
    a precharge circuit coupled to each of said at least one data line pair to apply thereto either a first supply voltage or a second supply voltage during a precharging portion of each operating cycle of the memory,
    wherein said ferroelectric capacitor of each memory cell has a first electrode thereof, supplied with a voltage intermediate the voltage difference of said first and second supply voltages, a second, opposing electrode thereof being coupled to one main terminal of the transistor switch corresponding thereto, a second main terminal of the transistor switch being coupled to a corresponding data line, and
    wherein said precharge circuit alternates between precharging both data lines of each data line pair with said first potential and precharging the same with said second potential.

17. A ferroelectric memory device according to claim 16, further comprising a control circuit, coupled to said precharge circuit and to supply the precharge voltage to said precharge circuit for each precharging operation.

18. A ferroelectric memory device according to claim 17, wherein said control circuit alternates between outputting said first supply voltage and outputting said second supply voltage in successive occurrences of a precharge cycle.

19. A ferroelectric memory device according to claim 18, wherein said control circuit includes a T flip-flop and a CMOS driver in series therewith, an output of the CMOS driver being coupled to said precharge circuit.

20. A ferroelectric memory device according to claim 17, wherein said control circuit alternates between outputting said first supply voltage and outputting said second supply voltage at regular intervals, each and every interval constituted by a same plural number of successive precharge cycles or a predetermined time period.

21. A ferroelectric memory device according to claim 17, wherein said control circuit includes a T flip-flop, a counter or a timer.

22. A ferroelectric memory device according to claim 16, wherein said second supply voltage is a positive voltage and said first supply voltage is a ground voltage.

23. A ferroelectric memory device according to claim 16, wherein said at least one data line pair includes plural pairs of data lines, and
    wherein said precharge circuit includes plural precharge unit circuits each of which is coupled to a corresponding data line pair to apply thereto either said first supply voltage or said second supply voltage as a precharge voltage, in response to a precharge control signal, the precharge control signal activating said precharge unit circuits only during each precharge operation.

24. A ferroelectric memory device according to claim 23, wherein each said precharge unit circuit includes MOS transistors in which two of which are connected via source and drain thereof between a precharge voltage supply terminal and the data lines of a corresponding data line pair, respectively, and a third MOS transistor is connected via the source-to-drain path thereof, as a voltage equalizing transistor, between the data lines of that data line pair.

25. A ferroelectric memory device according to claim 24, wherein a control circuit is coupled to supply to the precharge voltage supply terminal corresponding to said precharge unit circuits, respectively, either said first supply voltage or said second supply voltage.

26. A ferroelectric memory device according to claim 25, wherein said control circuit includes a T flip-flop, a counter or a timer.

27. A ferroelectric memory device according to claim 26, further comprising plural sense amplifiers each of which is coupled across the data lines of a respective data line pair, said sense amplifiers being activated in a normal memory operation cycle subsequently to selection of a memory cell in either a read or write operation, and being deactivated with start of each precharge operation, respectively.

28. A ferroelectric memory device according to claim 27, wherein each sense amplifier includes a MOS circuit.

29. A ferroelectric memory device according to claim 27, wherein each sense amplifier includes a pair of cross-connected CMOS inverters, the inputs and outputs of which are coupled to the data lines of a data line pair, respectively.

30. A ferroelectric memory device according to claim 16, further comprising at least one sense amplifier each of which is coupled across the data lines of each of said at least one data line pair, each said sense amplifier being activated in a normal memory operation cycle subsequently to selection of a memory cell in either a read or write operation and being deactivated with start of each precharge portion.

31. A ferroelectric memory device according to claim 1, wherein said precharge circuit alternates between precharging said data line with said first precharge potential and precharging said data line with said second precharge potential in each operating cycle of the memory.

* * * * *